United States Patent
Luhtala et al.

(10) Patent No.: US 12,216,172 B2
(45) Date of Patent: Feb. 4, 2025

(54) BATTERY MEASUREMENT

(71) Applicant: CELLIFE TECHNOLOGIES OY, Tampere (FI)

(72) Inventors: Roni Luhtala, Tampere (FI); Tuomas Messo, Tampere (FI); Jussi Sihvo, Tampere (FI)

(73) Assignee: CELLIFE TECHNOLOGIES OY, Tampere (FI)

(*) Notice: Subject to any disclaimer, the term of this patent is extended or adjusted under 35 U.S.C. 154(b) by 0 days.

(21) Appl. No.: 18/282,927

(22) PCT Filed: May 24, 2022

(86) PCT No.: PCT/FI2022/050353
§ 371 (c)(1),
(2) Date: Sep. 19, 2023

(87) PCT Pub. No.: WO2023/031501
PCT Pub. Date: Mar. 9, 2023

(65) Prior Publication Data
US 2024/0094301 A1 Mar. 21, 2024

(30) Foreign Application Priority Data
Sep. 2, 2021 (FI) .................................... 20215919

(51) Int. Cl.
*G01R 31/389* (2019.01)
*G01R 27/02* (2006.01)
(Continued)

(52) U.S. Cl.
CPC .......... *G01R 31/389* (2019.01); *G01R 27/02* (2013.01); *G01R 31/367* (2019.01); *G01R 31/396* (2019.01)

(58) Field of Classification Search
CPC ............ A61M 27/006; A61M 2205/18; A61M 2205/3317; A61M 2205/3327;
(Continued)

(56) References Cited

U.S. PATENT DOCUMENTS

| 5,744,962 A | 4/1998 | Alber et al. |
| 6,114,838 A | 9/2000 | Brink et al. |

(Continued)

FOREIGN PATENT DOCUMENTS

| CN | 106468738 A | 3/2017 |
| SE | 1851172 A1 | 3/2020 |

OTHER PUBLICATIONS

International Search Report and Written Opinion in Application No. PCT/FI2022/050353, mailed Sep. 5, 2022, 12 pages.

(Continued)

*Primary Examiner* — Alexander Satanovsky
*Assistant Examiner* — Trung Q Nguyen
(74) *Attorney, Agent, or Firm* — Meunier Carlin & Curfman LLC

(57) ABSTRACT

According to an example embodiment, a method is provided, the method comprising: determining a respective impedance curve for a plurality of cells extracted from a plurality of rechargeable batteries, wherein each impedance curve is descriptive of an internal impedance of the respective cell as a function of frequency over a predefined frequency range; determining, for each of the plurality of cells, respective one or more impedance characteristics based on the impedance curve determined for the respective cell; and sorting the plurality of cells into one or more quality classes in accordance with the one or more impedance characteristics determined for the plurality of cells.

12 Claims, 9 Drawing Sheets

(51) Int. Cl.
*G01R 31/367* (2019.01)
*G01R 31/396* (2019.01)

(58) Field of Classification Search
CPC ........ A61M 2205/50; A61M 2205/502; A61M 2205/52; G01D 5/12; G01D 7/00; G01R 31/389; G01R 31/396; G01R 31/367; G01R 27/02
USPC .................................................. 324/425–434
See application file for complete search history.

(56) References Cited

U.S. PATENT DOCUMENTS

| | | | |
|---|---|---|---|
| 11,598,810 B2* | 3/2023 | Cox ..................... | G01R 31/367 |
| 2005/0021254 A1* | 1/2005 | Merl .................... | G01R 31/389 |
| | | | 702/65 |
| 2012/0098500 A1* | 4/2012 | Vestama ............... | H01M 10/48 |
| | | | 320/149 |
| 2014/0315047 A1 | 10/2014 | Cattin et al. | |
| 2017/0003355 A1 | 1/2017 | Ranieri et al. | |
| 2019/0120910 A1 | 4/2019 | Ghantous et al. | |
| 2019/0154764 A1 | 5/2019 | Schlasza et al. | |
| 2020/0200825 A1* | 6/2020 | Izumi ...................... | G06N 3/04 |
| 2020/0209319 A1* | 7/2020 | Mitsui ................... | H01M 10/42 |
| 2022/0026494 A1* | 1/2022 | Lee ....................... | H02J 7/0049 |

OTHER PUBLICATIONS

International Preliminary Report on Patentability in Application No. PCT/FI2022/050353, mailed Jun. 19, 2023, 22 pages.

Search Report in Finnish Application No. 20215919, dated Jan. 11, 2022, 2 pages.

Search Report issued by the European Patent Office in the corresponding divisional EP application No. 24192620.3 mailed on Dec. 4, 2024 (2 pages).

Sihvo Jussi et al: "Fast Approach for Battery Impedance Identification Using Pseudo-Random Sequence Signals", IEEE Transactions On Power Electronics, Institute of Electrical and Electronics Engineers, USA, vol. 35, No. 3, Mar. 1, 2020 (Mar. 1, 2020), pp. 2548-2557, XP011761758, ISSN: 0885-8993, DOI: 10.1109/TPEL. 2019.2924286 (10 pages).

* cited by examiner

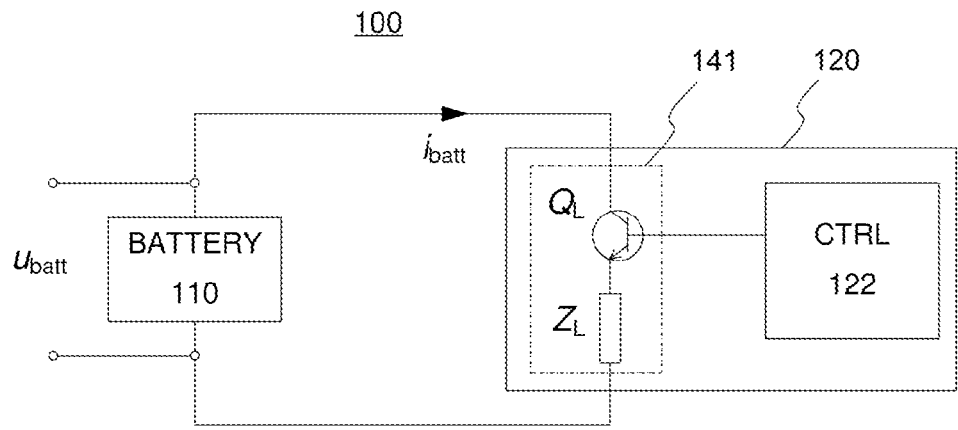

Set an impedance of an adjustable load to one of two or more predefined values according to a switching sequence that defines switching between the two or more predefined values as a function of time, so as to supply pulsed current to the adjustable load
202

Obtain respective indications of a voltage across the terminals of the battery and an electric current supplied to the adjustable load as a function of time
204

Derive an internal impedance of the battery on basis of the obtained voltage and the obtained electric current
206

```
┌─────────────────────────────────────────────────────────────┐
│   Disassemble a set of batteries into a plurality of cells  │
│                           252                               │
└─────────────────────────────────────────────────────────────┘
                              ↓
┌─────────────────────────────────────────────────────────────┐
│  Harmonize measurement conditions applied for the plurlaity of cells │
│                           254                               │
└─────────────────────────────────────────────────────────────┘
                              ↓
┌─────────────────────────────────────────────────────────────┐
│  Determine a respective impedance curve for each of the plurality of │
│  cells, where each impedance curve is descriptive of an internal     │
│  impedance of the respective cell as a function of frequency over a  │
│                   predefined frequency range                         │
│                           256                               │
└─────────────────────────────────────────────────────────────┘
                              ↓
┌─────────────────────────────────────────────────────────────┐
│  Determine respective one or more impedance characteristics for │
│  each of the plurality of cells based on the impedance curve    │
│                    determined therefor                          │
│                           258                               │
└─────────────────────────────────────────────────────────────┘
                              ↓
┌─────────────────────────────────────────────────────────────┐
│  Sort the plurality of cells into one of one or more cell quality classes │
│     in accordance with the one or more impedance characteristics          │
│                determined for the plurality of cells                      │
│                           260                               │
└─────────────────────────────────────────────────────────────┘
```

Figure 12

BATTERY MEASUREMENT

This is a U.S. national application of international application PCT/FI2022/050353 filed on May 24, 2022, and claiming priority to Finnish national application number FI20215919 filed on Sep. 2, 2021.

TECHNICAL FIELD

The example and non-limiting embodiments of the present invention relate to a technique for measuring characteristics of a rechargeable battery.

BACKGROUND

A vast amount of different mobile electrical apparatuses that are nowadays widely used both in professional and recreational context rely on operating power supplied by a rechargeable battery arranged in the device. Moreover, recent and continuing developments in battery technology are likely to render even a wider variety of mobile electrical apparatuses suitable for being powered by a rechargeable battery. Non-limiting examples in this regard include computing devices such as mobile phones, tablet computers, laptop computers and vehicles at least partially driven by electric power, such as bicycles, scooters, motorcycles, cars, buses, trucks, etc.

Typically, a rechargeable battery includes a plurality of cell modules arranged in series, in parallel, or in a mixture thereof to provide a desired voltage and capacity, where the cell modules are typically substantially identical or at least similar to each other. A cell module may comprise an individual cell or a cell assembly of two or more cells arranged in series, in parallel, or in a mixture thereof. The cells of the battery may be jointly referred to as a battery pack. In addition to the battery pack, the rechargeable battery typically further includes battery management system (BMS) for managing some aspects of internal operation of the battery, such as monitoring some aspects of state of the battery and protecting the battery from operating outside its safe operating area (in terms of voltage and/or current).

In a user point of view, important aspects characterizing a rechargeable battery applied as a power supply to an electrical apparatus include recharging time and operation time provided by a (fully) recharged battery as well as the ability of the battery to withstand repeated recharging and discharging without significantly increasing the charging time and/or without significantly reducing the operation time enabled by the recharged battery. Such user-perceivable characteristics of a rechargeable battery basically reflect battery characteristics such as the capacity of the battery (in terms of an amount of electrical energy it is able to store), a charging rate at which the battery can be recharged, a discharging rate at which the battery is typically discharged in the course of operation of the electrical apparatus and the battery life in terms of the number of charge-discharge cycles the battery is able to tolerate until its capacity is reduced to a significant extent.

Regarding the latter aspect, the repeated charge-discharge cycles, i.e. repeated process of recharging the battery and discharging the battery to supply power to the electrical apparatus, result in gradually decreasing the capacity of the battery, whereas mechanical stress occurring in the course of usage of the battery may also cause minor damage that does not break the battery but contributes towards decreasing capacity of the battery. In this regard, examples of battery-internal phenomena that contribute toward decreasing battery capacity include increasing thickness of solid-electrolyte interface thickening on electrodes of the battery, deactivation of charge carriers within the battery, dendrites growing between electrodes of the battery (risking a short-circuit in the battery), damage or passivation of electrodes of the battery, etc.

The capacity degradation of the rechargeable battery is typically not similar across the cells of a certain cell module of the battery pack and/or across cell modules of the battery pack, which may lead to a scenario where individual cells of the certain cell module and/or the cell modules of the battery pack that were originally identical in capacity exhibit different capacities. This, in turn, may result in imbalance between the individual cells of the certain cell module and/or between cell modules of the battery pack, which may speed up degradation of the overall capacity of the battery. On the other hand, due to uneven capacity degradation some of the individual cells of the certain cell module and/or some cell modules of the battery pack may still have a good capacity even though the overall capacity of the battery pack has degraded to a level that renders the battery virtually unusable. In such a scenario the individual cells and/or cell modules that still have a good capacity may be recycled as building blocks of a new battery pack. However, for safe operation of the new battery pack the individual cells and/or cell modules applied therefor need to be substantially similar in their characteristics, such as their capacity.

In this regard, known approaches for measuring the capacity of the battery pack are typically applicable for measuring the capacity of a cell module and for measuring the internal impedance of an individual cell as well. A well-known approach in this regard involves first charging the battery, the cell module or the individual cell to its full (remaining) charge, followed by fully discharging the battery, the cell module or the individual cell while measuring the capacity e.g. as ampere hours. While this serves as a proven and well-working approach, especially in case of batteries of high capacity it is necessarily rather time consuming, especially if carried out separately for a large number of cell modules or individual cells.

Another known approach for measuring the capacity of the battery pack via measuring the internal impedance of the battery pack using Electrochemical Impedance Spectroscopy (EIS). While the EIS enables relatively accurate and reliable measurement of the internal impedance of the battery pack over a range of frequencies, while on the other hand an EIS measurement is a relatively time consuming procedure.

SUMMARY

It is an object of the present invention to provide a technique for measuring an internal impedance of a rechargeable battery entity in reliable manner in a relatively short time. Additionally or alternatively, it is an object of the present invention to provide a technique for sorting cells originating from a plurality of rechargeable batteries for subsequent use based on their measured impedances.

According to an example embodiment, a method is provided, the method comprising: determining a respective impedance curve for a plurality of cells extracted from a plurality of rechargeable batteries, wherein each impedance curve is descriptive of an internal impedance of the respective cell as a function of frequency over a predefined frequency range; determining, for each of the plurality of cells, respective one or more impedance characteristics based on the impedance curve determined for the respective cell; and sorting the plurality of cells into one or more quality classes in accordance with the one or more impedance characteristics determined for the plurality of cells.

According to another example embodiment, an apparatus is provided, the apparatus arranged to: determine a respective impedance curve for a plurality of cells extracted from a plurality of rechargeable batteries (110), wherein each impedance curve is descriptive of an internal impedance of the respective cell as a function of frequency over a predefined frequency range; determine, for each of the plurality of cells, respective one or more impedance characteristics based on the impedance curve determined for the respective cell; and sort the plurality of cells into one or more quality classes in accordance with the one or more impedance characteristics determined for the plurality of cells.

According to another example embodiment, a computer program is provided, the computer program comprising computer readable program code configured to cause performing the method according to the example embodiment described in the foregoing when said program code is executed on one or more computing apparatuses.

The computer program according to the above-described example embodiment may be embodied on a volatile or a non-volatile computer-readable record medium, for example as a computer program product comprising at least one computer readable non-transitory medium having the program code stored thereon, which, when executed by one or more computing apparatuses, causes the computing apparatuses at least to perform the method according to the example embodiment described in the foregoing.

The exemplifying embodiments of the invention presented in this patent application are not to be interpreted to pose limitations to the applicability of the appended claims. The verb "to comprise" and its derivatives are used in this patent application as an open limitation that does not exclude the existence of also unrecited features. The features described hereinafter are mutually freely combinable unless explicitly stated otherwise.

Some features of the invention are set forth in the appended claims. Aspects of the invention, however, both as to its construction and its method of operation, together with additional objects and advantages thereof, will be best understood from the following description of some example embodiments when read in connection with the accompanying drawings.

BRIEF DESCRIPTION OF FIGURES

The embodiments of the invention are illustrated by way of example, and not by way of limitation, in the figures of the accompanying drawings, where

FIG. 5 illustrates a block diagram of some components of an impedance measurement arrangement including an adjustable load according to an example;

FIG. 7 illustrates a method according to an example;

FIG. 12 illustrates a method according to an example;

DESCRIPTION OF SOME EMBODIMENTS

Figure 1:
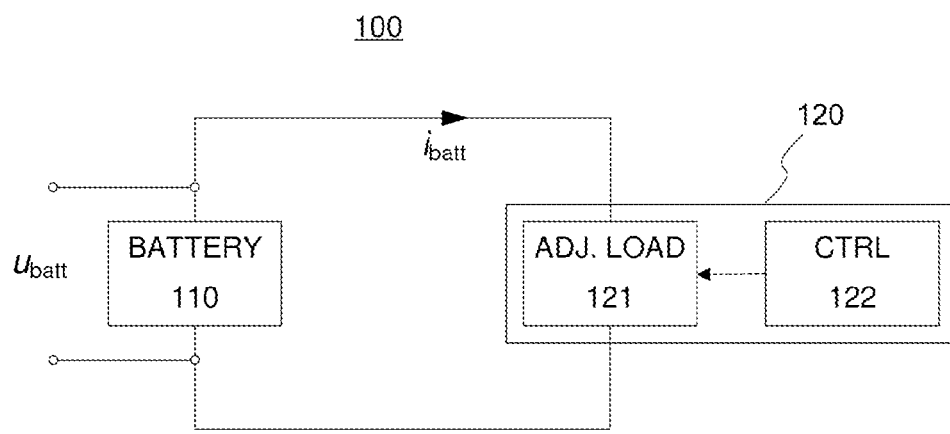
FIG. 1 illustrates a block diagram of some components of an impedance measurement arrangement according to an example.

FIG. 1 illustrates a block diagram of some components of a measurement arrangement 100 according to an example. The measurement arrangement 100 comprises a rechargeable battery 110 and an impedance measurement assembly 120. The impedance measurement assembly 120 comprises an adjustable load 121 and a controller 122, where the adjustable load 121 is coupled between terminals of the rechargeable battery 110 such that the adjustable load 121 is in series with the rechargeable battery 110 and where the controller 122 is provided for adjusting an impedance of the adjustable load 121. In addition to being arranged for adjusting the impedance of the adjustable load 121, the controller 122 may further serve for deriving an internal impedance of the battery 110 on basis of a voltage across the rechargeable battery 110 and/or for measuring electric current supplied to the adjustable load 121.

According to an example, the rechargeable battery 110 of the measurement arrangement 100 may comprise any battery suitable to serve as a power supply to an electrical apparatus or system e.g. as an integrated component of the apparatus or system or as a component that may be coupled to the electrical apparatus or system. As a few examples in this regard, the rechargeable battery 110 may be suitable for serving as a power supply to a handheld mobile computer device such as a mobile phone, a tablet computer or a laptop computer or to a portable electrical apparatus of other type, such as a gaming device, a music player, a navigation device, headphones or a headset, a camera, etc. In further examples, the rechargeable battery 110 may be one integrated to an electric or hybrid vehicle at least partially driven by electric power, such as a bicycle, a scooter, a motorcycle, a car, a bus, a truck, special-purpose vehicles employed e.g. in ports and in mining, etc. In another example, the rechargeable battery 110 may serve as a component of an uninterruptible power supply (UPS) or a power bank apparatus that is connectable to the electrical apparatus or system to supply power thereto. In further examples, the rechargeable battery 110 of the measurement arrangement 100 may comprise an individual cell or a battery module (including two or more cells arranged in series, in parallel, or in a mixture thereof) of a battery suitable for serving as a power supply to an electrical apparatus or system.

The rechargeable battery 110 may be provided using any suitable battery technology known in the art. In a non-limiting example, the rechargeable battery may comprise a lithium-ion battery, whereas in other examples another battery technology, such as solid-state, lithium-sulfur or graphene-based batteries may be applied instead. In the following, the rechargeable battery 110 is predominantly referred to, in short, as a battery 110.

Referring back to the impedance measurement assembly 120, the impedance of the adjustable load 121 may be selected from two or more predefined values, which results in an electric current $i_{batt}$ supplied to the adjustable load 121 changing accordingly in dependence of a nominal voltage $U_{batt}$ (e.g. an open-circuit voltage) across the terminals of the rechargeable battery 110. Denoting an instantaneous impedance of the adjustable load 121 as $Z_{load}$, the electric current $i_{batt}$ through the battery 110 may be computed as $$i_{batt} = U_{batt}/Z_{load}.$$

The controller 122 may be applied to adjust the impedance of the adjustable load 121 over time according to a certain pattern, which results in corresponding perturbations in the electric current $i_{batt}$ drawn from the battery 110. The perturbation in the electric current (batt, in turn, result in a corresponding change in a voltage $u_{batt}$ across the terminals of the battery 110. Consequently, the internal impedance of the battery 110, denoted as $Z_{batt}$, may be obtained via measuring the voltage $u_{batt}$ over time during the current perturbations and computing a ratio of the measured voltage response $u_{batt}$ and the electric current $i_{batt}$ over time, e.g. as $$Z_{batt} = u_{batt}/i_{batt}.$$

In this regard, application of a suitable predefined switching sequence (or a switching pattern) for changing the impedance of the adjustable load 121 between the two or more predefined impedances enables generating current perturbations that represent a frequency range of interest. Using Fourier techniques known in the art for transforming the voltage $u_{batt}$ and the electric current $i_{batt}$ to the frequency domain, this enables determining the internal impedance of the battery 110 across the frequency range of interest as a function of frequency, denoted as $Z_{batt}(\omega)$, e.g. as $$Z_{batt}(\omega) = u_{batt}(\omega)/i_{batt}(\omega).$$

The measurement arrangement 100 according to the example of FIG. 1 allows for measuring the internal impedance of the battery 110 without usage of an external power source to supply a charging current to the battery 110 but rather makes use of the internal charge of the battery 110 to generate the current perturbations that enable the impedance measurement via controlled variation of the impedance of the adjustable load 121.

Along the lines described in the foregoing, the controller 122 may be arranged to selectively set the impedance of the adjustable load 121 to one of two or more predefined values as a function of time according to a certain pattern, which may be referred to as a switching sequence or a switching pattern. Such variation of the impedance of the adjustable load 121 results in providing the electric current $i_{batt}$ as a pulsed current that exhibits a variation that corresponds that defined in the switching sequence. Moreover, the controller 122 may be further arranged to obtain respective indications of the instantaneous voltage $u_{batt}$ across the terminals of the rechargeable battery 110 for a time period that corresponds to the controller 122 switching between the two or more predefined impedance values of the adjustable load 121 according to the switching sequence. In this regard, in an example, the controller 122 may include respective components for measuring the voltage $u_{batt}$ and/or the electric current $i_{batt}$ (not shown in the illustration of FIG. 1), whereas in another example the controller 122 may receive the respective indications of the voltage $u_{batt}$ and/or the electric current $i_{batt}$ from respective (e.g. external) measurement arrangements coupled thereto. Yet further, the controller 122 may be arranged to derive the internal impedance of the battery 110 on basis of the voltage $u_{batt}$ and the electric current $i_{batt}$ measured during application of the switching sequence. The controller 122 may comprise a processing apparatus and a memory, where the memory is arranged to store program code that, when executed by the processing apparatus, causes the controller 122 to carry out the operations assigned therefor accordingly.

In various examples, the switching sequence that defines switching between the two or more predefined impedance values as a function of time may be a predefined one, it may be random one, or it may be pseudorandom one. In all these examples, a timing of changes from one of the two or more predefined impedance values to another may be designed such that they represent a frequency range of interest. Application of the switching sequence results in the electric current $i_{batt}$ supplied to the adjustable load 121 exhibiting respective changes that represent the frequency range of interest, thereby enabling derivation of the internal impedance of the rechargeable battery 110 as a function of frequency $Z_{batt}(\omega)$ across the frequency range of interest. As a particular example, the switching sequence may comprise or it may be based on at least one multi-frequency pseudo-random pulse sequence (PRPS) of predefined characteristics known in the art. In time domain, such a sequence appears as a time series of pulses whose amplitudes and pulse widths depend on frequency characteristics of the sequence. In frequency domain, a multi-frequency PRPS may be considered to include a predefined number of regularly-spaced non-zero frequency components, where each frequency component appears at a frequency that is an integer multiple of a frequency of the lowermost frequency component of the multi-frequency PRPS. Such frequency content of a multi-frequency PRPS sequency may be referred to as a linear one. The multi-frequency PRPS may be derived via selecting a generation frequency $f_{gen}$ and a sequence length N, where the generation frequency $f_{gen}$ defines the (maximum) frequency of switching from one pulse amplitude to another and the sequence length N defines the length of the sequence as number of 'samples' included in the sequence. With the generation frequency $f_{gen}$ and the sequence length N fixed, the frequency resolution f res of the multi-frequency PRPS, i.e. the frequency-domain spacing between two adjacent non-zero frequency components of the PRPS, may be derived as $$f_{res} = f_{gen}/N.$$

Figure 2:
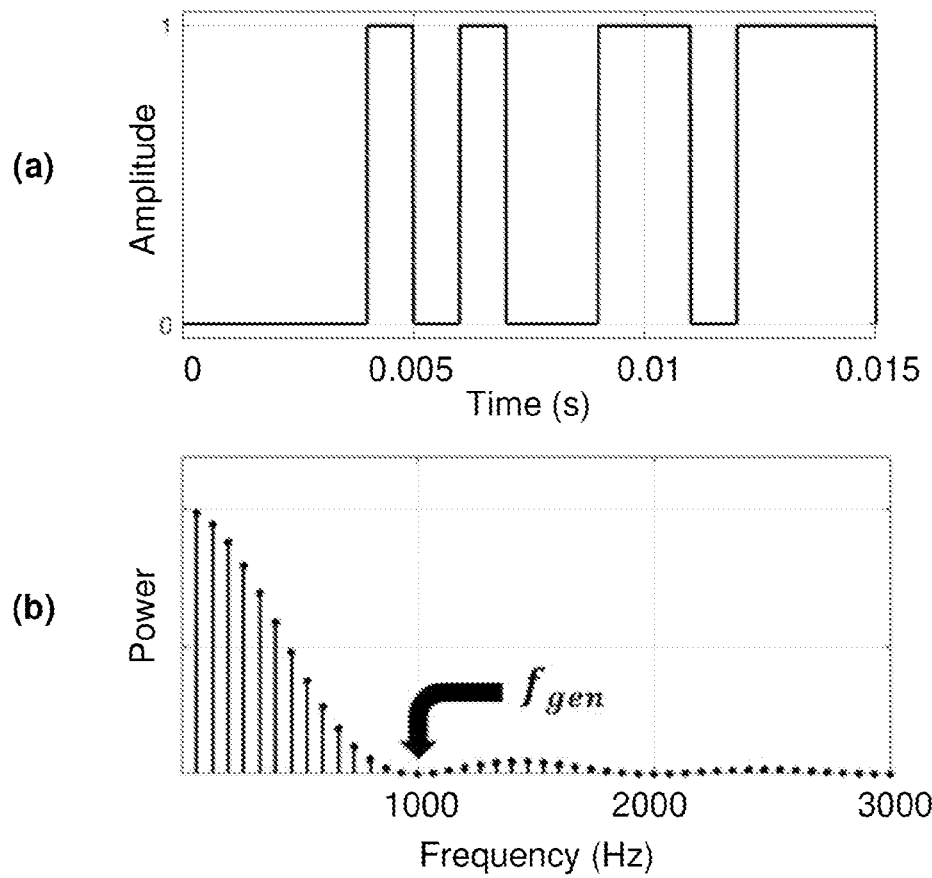
FIG. 2 illustrates an example of a multi-frequency pseudo-random pulse sequence (PRPS) according to an example.

A multi-frequency PRPS may be further characterized via the number of different amplitudes appearing in the sequence. While in principle any number of different amplitudes may be applied, typical examples in this regard include pseudo-random binary sequences (PRBSs) that make use of two different amplitudes and pseudo-random ternary sequences (PRTSs) that make use of three different amplitudes. FIG. 2 illustrates an example of a multi-frequency PRBS where the generation frequency $f_{gen}$ is 1000 Hz, the sequence length N is 15 and the two amplitudes applied in the sequence are denoted as 1 and 0. In particular, the illustration (a) of FIG. 2 depicts the multi-frequency PRBS in time domain, whereas the illustration (b) of FIG. 2 depicts the multi-frequency PRBS in frequency domain.

The controller 122 may derive a multi-frequency PRPS appliable for generation of the switching sequence, for example, via using one or more predefined rules that enable deriving the multi-frequency PRPS according to one or more pulse sequence parameters. As an example in this regard, the pulse sequence parameters may define one or more of the following characteristics of the PRPS: the length of the sequence, the frequency content of the sequence, available pulse amplitudes of the sequence (in time domain), etc. In another example, the controller 122 may comprise or otherwise have access to a memory that stores one or more predefined PRPSs of desired characteristics and, consequently, generation of the PRPS may comprise the controller 122 reading the PRPS to be applied from the memory.

While each of PRBS and PRTS enable defining a switching sequence that covers a frequency range of interest and hence ensures an impedance measurement that simultaneously considers frequencies across the range of interest, thereby enabling impedance measurement at improved accuracy and reliability while still allowing for relatively short measurement time in comparison to previously known impedance measurement approaches. In this regard, usage of a PRTS may provide an advantage over a PRBS via enabling improved control over the frequency content within the frequency range of interest without increasing the measurement time. In particular, usage of a PRTS enables improved control over harmonic frequencies appearing in the switching sequence via excluding second and third order harmonic frequencies from the switching sequence that might otherwise cause inter-frequency disturbances in the impedance measurement of a non-linear system such as the battery 110 and, consequently, compromise accuracy and/or reliability of the measurement.

Figure 3:
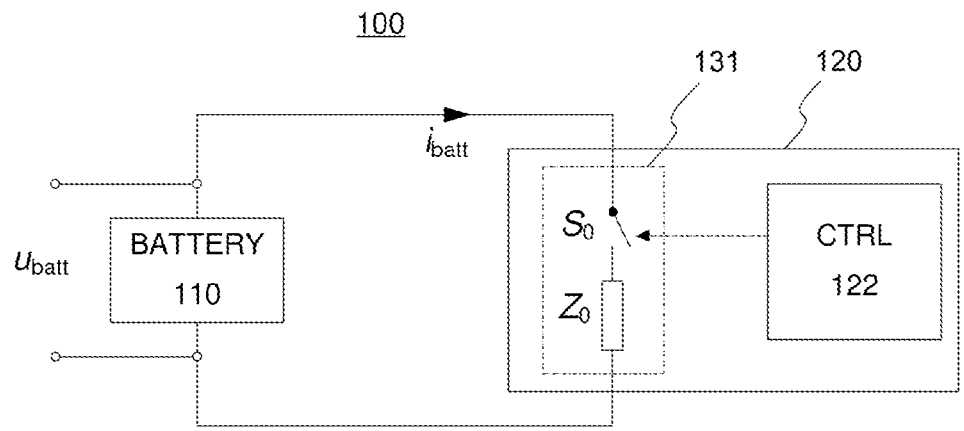
FIG. 3 illustrates a block diagram of some components of an impedance measurement arrangement including an adjustable load according to an example.

FIG. 3 schematically illustrates the measurement arrangement 100 comprising an adjustable load 131 according to an example, where the adjustable load 131 may serve as the adjustable load 121 of the example of FIG. 1. The adjustable load 131 comprises a switch $S_0$ arranged in series with a load having an impedance $Z_0$ (e.g. a resistor having a resistance $R_0$) such that the current path that includes the switch $S_0$ and the load couples the terminals of the battery 110 to each other, where the switch $S_0$ may be selectively opened or closed under control of the controller 122 (e.g. in accordance with a control signal issued from the controller 122). In this regard, the controller 122 may obtain (e.g. derive) a control sequence that represents a time window of desired duration that defines alternating time periods of keeping the switch $S_0$ open or closed such that the changes between open and closed states of the switch $S_0$ represent the frequency range of interest. The control sequency may be also referred to as a control pattern. Herein, the control sequence may comprise or be based on a random or pseudo-random binary sequence that defines for a plurality of time periods of the control sequence either a first value or a second value, whereas the controller 122 may control the switch $S_0$ in accordance with the control sequence by keeping it open during time periods for which the control sequence indicates a first value and by keeping it closed during time periods for which the control sequence indicates a second value. As an example in this regard, the control sequence may comprise or it may be based on a multi-frequency PRBS of desired characteristics. Consequently, depending on the state of the switch $S_0$, the impedance of the adjustable load 131 is either infinity or $Z_0$, thereby resulting in changing the electric current $i_{batt}$ between zero and $u_{batt}/Z_0$ in accordance with a switching sequence that is directly defined by the control sequence derived by the controller 122. As an example, assuming that the nominal voltage across terminals of the battery 110 is 3.6 V and that the impedance $Z_0$ is 10Ω, the electric current substantially varies between values 0 A and 0.36 A according to the switching sequence.

Figure 4:
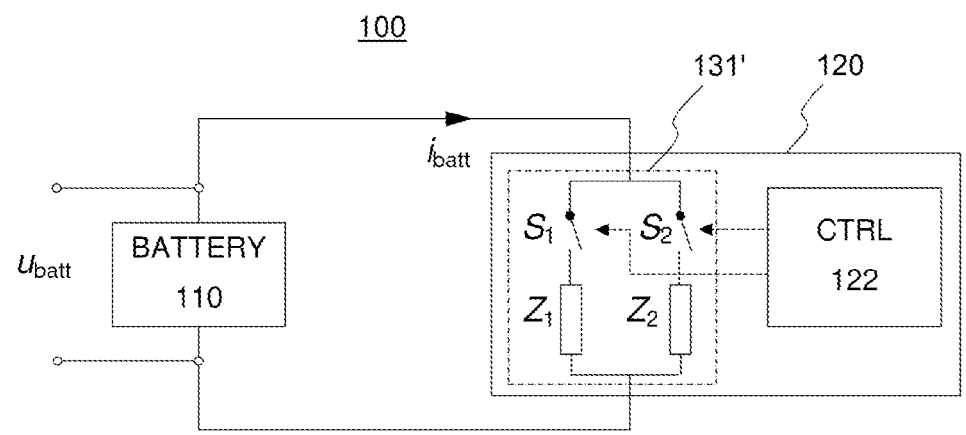
FIG. 4 illustrates a block diagram of some components of an impedance measurement arrangement including an adjustable load according to an example.

FIG. 4 schematically illustrates the measurement arrangement 100 comprising an adjustable load 131' according to another example, where the adjustable load 131' may serve as the adjustable load 121 of the example of FIG. 1. The adjustable load 131' comprises a first current path including a first switch $S_1$ arranged in series with a first load having a first impedance $Z_1$ (e.g. a resistor having a resistance $R_1$) and a second current path including a second switch $S_2$ arranged in series with a second load having a second impedance $Z_2$ (e.g. a resistor having a resistance $R_2$), where the second impedance $Z_2$ is substantially identical to the first impedance $Z_1$ and where the first and second current paths are parallel to each other, thereby constituting two separate current paths coupling the terminals of the battery 110 to each other. The controller 122 may operate to selectively keep each of the first switch $S_1$ and the second switch $S_2$ open or closed in accordance with a respective control sequence obtained at the controller 122. In this regard, the controller 122 may obtain (e.g. derive) a first control sequence and a second control sequence of the kind described above with references to the example of FIG. 3. In this regard, the first and second control sequences may be derived based on a PRTS that represents a time window of desired duration and the frequency range of interest via decomposing the PRTS into the first and second binary sequences, respectively, serve as the first second control sequences such that operating the first switch $S_1$ according to the first binary sequence and operating the second switch 52 in accordance with the second binary sequence results in a switching sequence according to the PRTS.

Hence, the controller 122 may control the first switch $S_1$ in accordance with the first control sequence by keeping it open during time periods for which the first control sequence indicates a first value and by keeping it closed during time periods for which the first control sequence indicates a second value and control the second switch $S_2$ in accordance with the second control sequence by keeping it open during time periods for which the second control sequence indicates a first value and by keeping it closed during time periods for which the second control sequence indicates a second value. Consequently, depending on the respective states of the first switch $S_1$ and the second switch $S_2$, the impedance of the adjustable load 131' is either infinity, $Z_1$, or $Z_{1\|2}$, where $Z_{1\|2}$ denotes the combined impedance of $Z_1$ and $Z_2$ arranged in parallel (i.e. $1/Z_{1\|2} = 1/Z_1 + 1/Z_2$), thereby resulting in changing the electric current $i_{batt}$ between zero, $u_{batt}/Z_1$ and $u_{batt}/Z_{1\|2}$ in accordance with a switching sequence that substantially follows the multi-frequency PRTS applied as basis for deriving the first and second control sequences. As an example, assuming that the nominal voltage across terminals of the battery 110 is 3.6 V and that the impedances $Z_1$ and $Z_2$ are set to 16Ω, the electric current/bait substantially varies between values 0 A, 0.225 A and 0.45 A according to the switching sequence.

In a further example in the framework of the example of FIG. 4, the first impedance $Z_1$ and the second impedance $Z_2$ may be set to values different from each other, thereby resulting in four different impedance levels of the adjustable load 131' depending on the respective states of the first switch $S_1$ and the second switch $S_2$ and, consequently, in changing the electric current $i_{batt}$ between respective four different values accordingly. In yet further examples in the framework of respective examples of FIGS. 3 and 4, the adjustable load 121 may be one that has more than two current paths therethrough, each having a respective switch $S_k$ and a respective impedance $Z_k$ connected in series, thereby enabling provision of more than four impedance levels that result in changing the electric current $i_{batt}$ between respective more than four levels accordingly.

FIG. 5 schematically illustrates the measurement arrangement 100 comprising an adjustable load 141 according to a further example, where the adjustable load 141 may serve as the adjustable load 121 of the example of FIG. 1. The adjustable load 141 comprises a transistor $Q_L$ arranged in series with a load having an impedance $Z_L$, where the transistor $Q_L$ may be applied regulate the electric current $i_{batt}$ therethrough under control of the controller 122 (e.g. via a control signal or control current issued via operation of the controller 122). Consequently, along the lines of the exemplifying adjustable loads 131 and 131' described in the foregoing, the controller 122 may change the impedance of the adjustable load 141 between two or more predefined values according to a switching sequence (e.g. a multi-frequency PRBS or a multi-frequency PRTS) obtained at the controller 122 via regulating the current through the transistor $Q_L$ accordingly, thereby switching the electric current $i_{batt}$ through the adjustable load 121 between respective two or more levels according to the switching sequence. In a variation of the example of FIG. 5, the internal impedance of the transistor $Q_L$ may be considered to constitute a sufficient load for carrying out the measurement and, consequently, the load having the impedance $Z_L$ may be omitted from the circuit.

Figure 6:
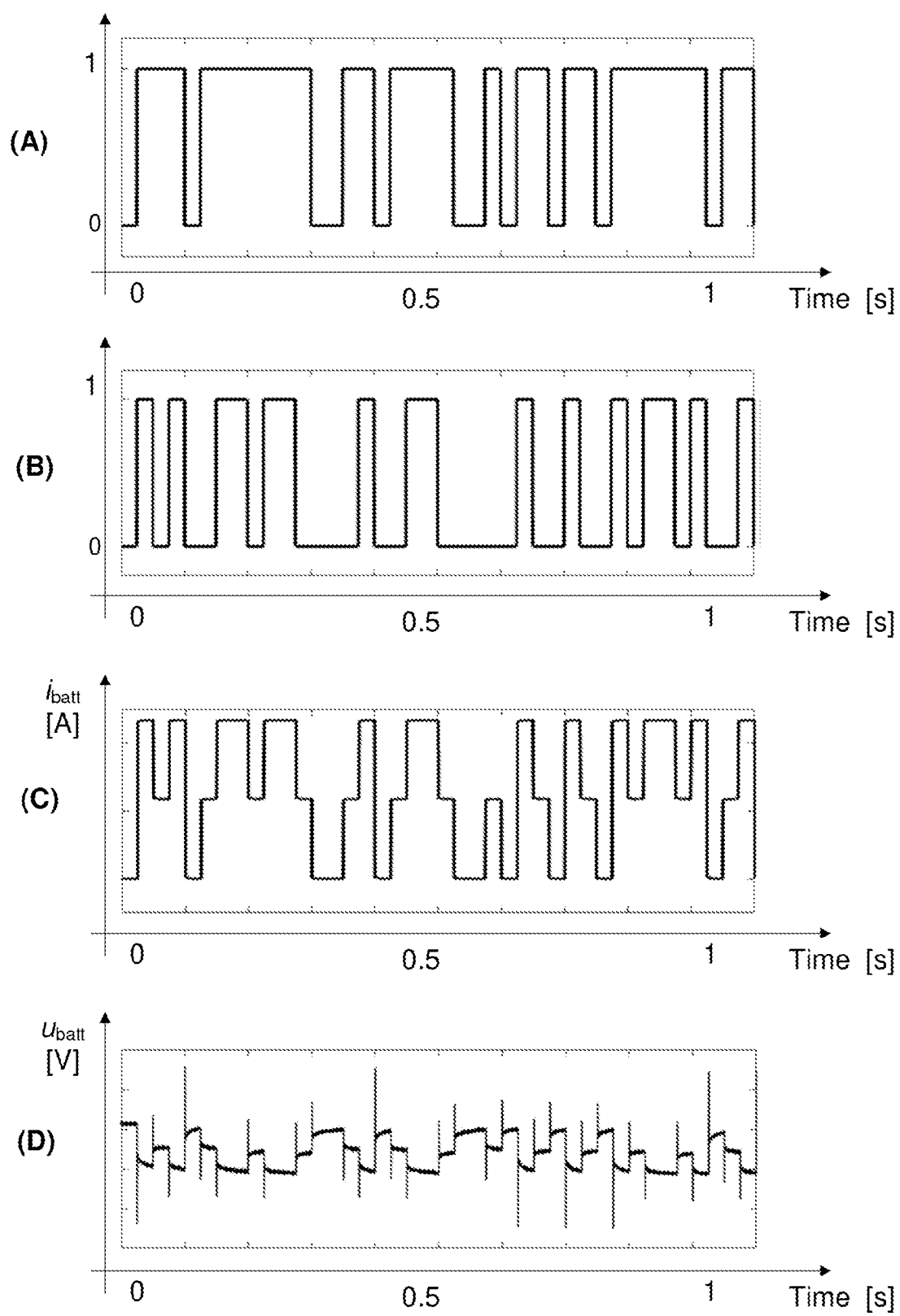
FIG. 6 illustrates a relationship between control sequences and a switching sequence according to an example.

FIG. 6 illustrates a non-limiting example concerning the relationship between control sequences and a switching sequence. Therein, the illustrations (A) and (B) depict respective time segments of control sequences that are applicable for use as the first and second control sequences for controlling operation of the first switch $S_1$ and the second switch $S_2$ of the adjustable load 131'. Moreover, the illustration (C) depicts the electric current $i_{batt}$ arising from application of the first and second control sequences according to the illustrations (A) and (B) as a function of time, whereas the illustration (D) depicts variation in the voltage $u_{batt}$ across the terminals of the battery 110 for the corresponding time period as a function of time.

The characteristic and operation of the impedance measurement assembly 120 for measuring the internal impedance of the battery 110 described in the foregoing and/or in the following may be, alternatively, described as a steps of a method. As an example in this regard, FIG. 7 illustrates a method 200, which may be carried out, for example, by the controller 122. Respective operations described with references to blocks 202 to 206 pertaining to the method 200 may be implemented, varied and/or complemented in a number of ways, for example as described with references to elements of the impedance measurement arrangement 100 and/or in the following.

The method 200 commences by setting the impedance of the adjustable load 121 to one of the two or more predefined values according to a switching sequence, which switching sequence defines switching between the two or more predefined values as a function of time, so as to supply pulsed current to the adjustable load 121, as indicated in block 202. The method 200 further comprises obtaining respective indications of the voltage $u_{batt}$ across the terminals of the battery 100 and the electric current $i_{batt}$ supplied to the adjustable load 121 as a function of time, as indicated in block 204, and deriving the internal impedance of the battery 110 on basis of the obtained voltage and the obtained electric current, as indicated in block 206.

Along the lines described in the foregoing, the switching sequence applied for controlling switching between the two or more impedance values of the adjustable load 121 in the course of the impedance measurement may represent a predefined frequency range, which translates into corresponding frequency range being represented by the electric current $i_{batt}$ supplied to the adjustable load 121 and in the voltage $u_{batt}$ across the battery 110. Consequently, derivation of the internal impedance may comprise deriving the internal impedance of the battery 110 as a function of frequency in view of the frequencies represented in the variations induced to the electric current $i_{batt}$ supplied to the adjustable load 121 and in the voltage $u_{batt}$ across the battery 110. Considering the internal impedance of the battery 110 as a function of frequency over the frequency range of interest provides an advantage over previously known solutions that typically consider the impedance only at a single frequency point (e.g. impedance at 1 kHz or DC resistance only). In particular, knowledge of the internal resistance of the battery 110 across the frequency range of interest provides a more comprehensive and reliable measure of the condition of the battery 110 in comparison to solutions that only consider a single frequency point, thereby facilitating detection of shortcomings in battery condition and/or performance that may go undetected when considering only a single frequency point.

An applicable duration for the switching sequence and hence for the duration of the impedance measurement applied to the battery 110 depends on the frequency range of interest the applied switching sequence serves to represent. In general, the frequency range of interest may extend from frequency $f_{min}$ to frequency $f_{max}$, where in non-limiting examples the frequency range of interest may comprise frequencies from 0.1 Hz to 2 kHz or frequencies from 1 Hz to 5 kHz. According to an example, the duration $T_m$ of the measurement may be chosen in view of a desired value of the frequency $f_{min}$ that serves as the lower end of the frequency range of interest, e.g. as $T_m=1/f_{min}$, whereas in another example the frequency $f_{min}$ may be chosen in view of the desired measurement time $T_m$. The upper end $f_{max}$ of the frequency range of interest may be chosen in view of the generation frequency $f_{gen}$ of the multi-frequency PRPS serving as the switching sequence, e.g. as $f_{max}=f_{gen}/2$. In various examples, an applicable duration of the measurement may be in a range from 0.5 to 10 seconds. The impedance measurement according to the present disclosure can be hence carried out significantly faster in comparison to prior art methods that rely on the EIS or on a procedure that involves first charging the battery 110 its full capacity and measuring its capacity while fully discharging the battery 110.

Figure 8:
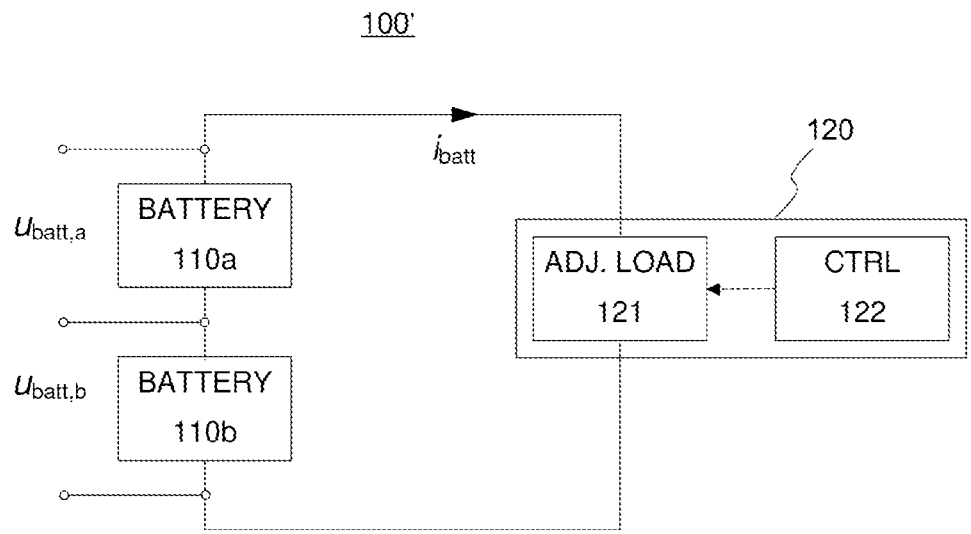
FIG. 8 illustrates a block diagram of some components of an impedance measurement arrangement according to an example.

The examples described in the foregoing refer to the rechargeable battery 110 in singular. In other examples, the impedance measurement arrangement may be applied for simultaneous measurement of respective impedance of two or more rechargeable batteries. As a non-limiting example in this regard, FIG. 8 illustrates a block diagram of some components of an impedance measurement arrangement 100', where a first rechargeable battery 110a and a second rechargeable battery 110b are connected in series for impedance measurement using the impedance measurement assembly 120. In this example, the impedance measurement is similar to that described in the foregoing for the single battery 110 apart from measurement of the respective voltages $u_{batt,a}$ and $u_{batt,b}$ across terminals of the respective one of the first battery 110a and the second battery 110b and separate derivation of the respective internal impedances thereof using the procedures described in foregoing. The impedance measurement arrangement 100' readily generalizes into measurement of respective internal impedances of more than two batteries connected in series.

In a further example, the impedance measurement assembly 120 may be applied for measuring the (combined) impedance of two or more batteries arranged in parallel between via coupling the respective terminals of each of the two or more batteries arranged in parallel to each other through the adjustable load 121, which facilitates determining overall status of a battery back and/or finding a 'weak link' among the two or more batteries subjected for the impedance measurement. In various examples, the two or more batteries arranged in series or in parallel for the impedance measurement may be respective separate battery packs (of separate battery units), respective individual cells of a single battery pack or separate battery packs, respective battery modules of a single battery pack or separate battery packs, etc.

Figure 9:
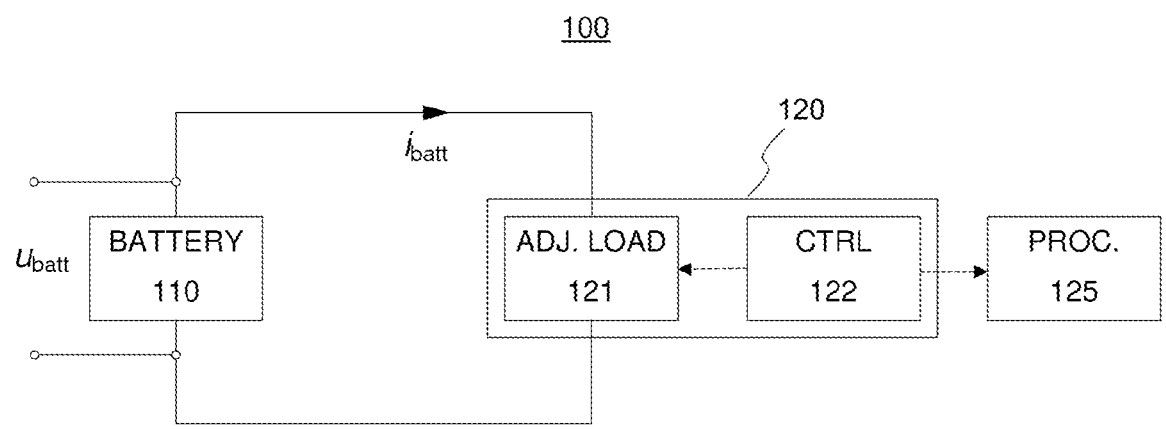
FIG. 9 illustrates a block diagram of some components of an impedance measurement system according to an example.

In the examples described in the foregoing, the controller 122 is described as an entity that may be arranged to adjust the impedance of the adjustable load 121 as a function of time according to the applied switching pattern, receive the respective indications of the electric current $i_{batt}$ and the voltage $u_{batt}$ across the terminals of the battery 110 and derive the internal impedance of the battery 110 on basis of the voltage $u_{batt}$ and the electric current $i_{batt}$ measured during application of the switching sequence. In another example, the controller 122 may be arranged to adjust the impedance of the adjustable load 121 as a function of time according to the applied switching pattern, receive the respective indications of the electric current $i_{batt}$ and the voltage $u_{batt}$ across the terminals of the battery 110 and provide the measured electric current $i_{batt}$ and the voltage $u_{batt}$ to a processing unit 125, which may be arranged to derive the internal impedance of the battery 110 on basis of the voltage $u_{batt}$ and the electric current $i_{batt}$ obtained from the controller 122 may be carried out by an (external) processing unit 125, as illustrated in an exemplifying block diagram depicted in FIG. 9. In this regard, the processing unit 125 may comprise a processing apparatus and a memory, where the memory is arranged to store program code that, when executed by the processing apparatus, causes the processing unit 125 to carry out derivation of the internal impedance of the battery 110.

The measured internal impedance of the battery 110 across the frequency range of interest may be provided and/or considered as an impedance curve of the battery 110 and it may be also referred to as an electrical fingerprint of the battery 110 that indicates and/or enables deriving several electrical characteristics that are descriptive of condition of the battery 110, e.g. one or more of the following:
- (remaining) capacity of the battery 110 to store electrical energy,
- self-discharge rate of the battery 110,
- maximum output power of the battery 110,
- short-circuit current of the battery 110,
- heat generation rate (or heating rate) of the battery 110 upon charging/discharging,
- internal faults of the battery 110,
- respective states of one or more internal aging processes of the battery 110.

Figure 10:
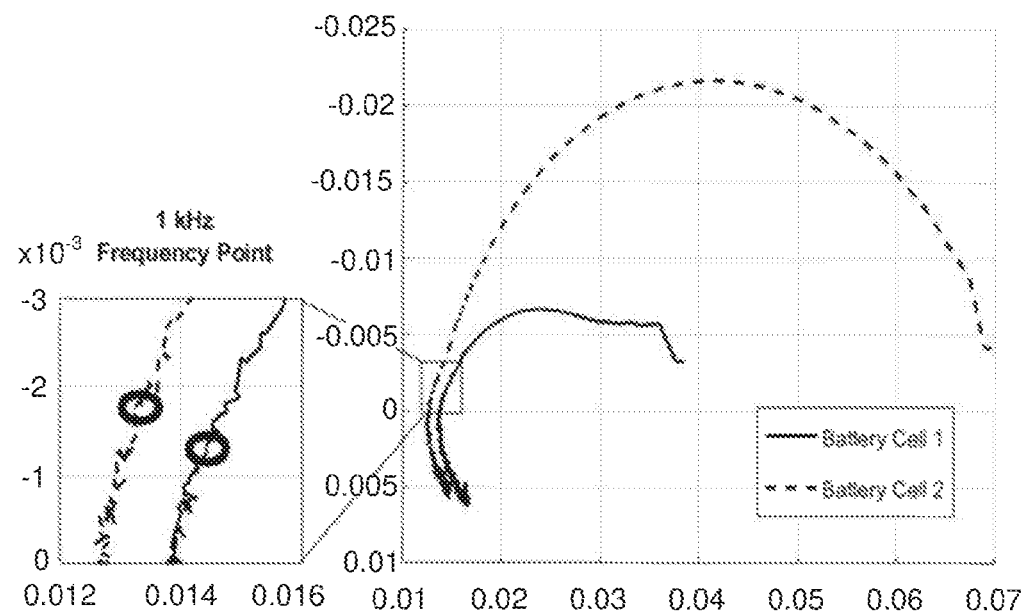
FIG. 10 illustrates respective internal impedances of two rechargeable batteries according to an example.

Since the impedance is a complex-valued measure, the impedance curve of the battery 110 may be illustrated, for example, as a curve that illustrates the real component and the imaginary component of the impedance on the complex plane. As an example in this regard, FIG. 10 illustrates respective impedance curves of a first battery that has a good remaining capacity and that can be assumed to be in good condition (the solid curve) and a second battery that has compromised capacity and that can be assumed be in a less-than-good condition (the dashed curve). The example of FIG. 10 also illustrates the above-discussed shortcoming of impedance measurement: at the 1 kHz point typically applied for impedance measurements, the second battery actually appears to be in a better condition in comparison to the first battery (due to the real part of the impedance at 1 kHz point showing smaller resistance for the second battery), whereas the overall shape of the respective impedance curves for the first and second batteries reveal the fact that the second battery is damaged or worn to an extent that it may constitute a safety risk.

In addition to serving as a direct measure of the condition of the battery 110, the impedance curve of the battery 110 is also usable, for example, estimating applicability of the battery 110 or its battery pack to serve its current purpose or estimating applicability of the battery pack of the battery 110 for reuse as a component of another device or apparatus. Moreover, the impedance measurement according to the present disclosure is applicable for finding individual cells or cell modules that are applicable for being reused as building blocks for a 'second-life battery': it is important to use cells or cell modules that are substantially similar in terms of their remaining capacity (and/or in terms of one or more other electrical characteristics) in order to provide a stable battery pack that reuses cells or cell modules applied earlier as components of another battery. In contrast, usage of cells or cell modules that are substantially different in terms of their (remaining) capacity (and/or in terms of one or more other electrical characteristics) risks rapid capacity degradation of the battery pack and may result in an unstable battery pack.

In this regard, the internal impedance across the frequency range of interest captured in the impedance curve provides a measure that usable for finding cells or cell modules that are substantially similar in their (remaining) capacity for serving as respective building blocks of a certain second-life battery pack: one may employ the impedance measurement according to the present disclosure to derive the respective impedance curve that covers the frequency range of interest for a plurality of cells or cell modules considered as potential building blocks for the certain second-life battery pack and select those cells or cell modules that exhibit substantially similar internal impedance across the frequency range of interest (while discarding those cells or cell modules that exhibit non-matching internal impedance). As an example, comparison and selection of the cells or cell modules in order to find cells or cell modules exhibiting substantially similar internal impedance may involve direct computation of differences between respective impedance curves of the cells or cell modules under consideration or computation of differences between respective derivatives of the impedance curves of the cells or cell modules under consideration, either across the frequency ranges of interest in its entirety, on one or more sub-ranges of the frequency range of interest, or at a plurality of predefined frequency point within the frequency range of interest. An analysis that involves the comparison of the cells or cell modules may be carried out, for example, by the controller 122, by the processing unit 125, or the processing involved in the analysis may be shared between the controller 122 and the processing unit 125.

Figure 11:
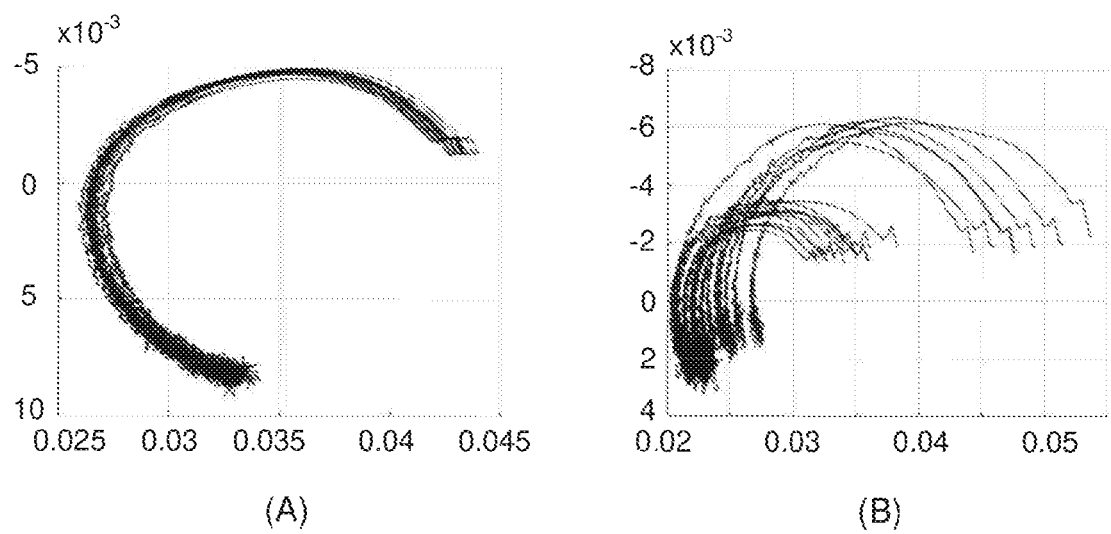
FIG. 11 illustrates internal impedances of a plurality of cells or cell modules suitable for a rechargeable battery according to an example.

In another example, the comparison and selection may rely on visual inspection of the impedance curves determined for the cells or cell modules under consideration across the frequency range of interest in the complex plane. Visualization of the internal impedance may be carried out, for example, by the controller 122, by the processing unit 125, or the processing involved in the analysis may be shared between the controller 122 and the processing unit 125. As an example of visualization of the impedance curves derivable using the approach described in the present disclosure, the illustration (A) of FIG. 11 depicts a plurality of impedance curves that represent respective internal impedances of a plurality of cells or cell modules that are substantially similar to each other in their (remaining) capacity and that are hence safe for reuse as building blocks for the same second-life battery pack, while the illustration (B) of FIG. 11 depicts a plurality of impedance curves that represent respective internal impedances of a plurality of cells or cell modules that are substantially different from each other in their (remaining) capacity and that are hence unsafe for reuse as building blocks for the same battery pack.

While the examples described above provide an outline of using the impedance curves obtained via the impedance measurement applied to a set of batteries 110, to respective cell modules of the set of batteries 110 or to respective individual cells or cell modules of the set of batteries 110 for estimating their condition and/or their suitability to serve as building blocks of a 'second life battery', more detailed examples in this regard are provided in the following.

In an example, a procedure for sorting battery cells of a set of used batteries 110 may be carried out in accordance with a method 250 illustrated in FIG. 12. The method 250 may include the following steps:
  disassemble the batteries 110 into a plurality of cells (block 252);
  harmonize measurement conditions for the plurality cells (block 254);
  determine a respective impedance curve for each of the plurality of cells, where each impedance curve is descriptive of an internal impedance of the respective cell as a function of frequency over a predefined frequency range (block 256);
  determine respective one or more impedance characteristics for each of the plurality of cells based on the impedance curve determined therefor (block 258); and
  sort the plurality of cells into one or more cell quality classes in accordance with the one or more impedance characteristics determined for the plurality of cell (block 260).

The steps 252 to 260 of the method 250 may be varied or complemented in a number of ways, for example as described in the foregoing and/or in the following. The method 250 may be complemented with further method steps in addition to the steps described with references to blocks 252 and 260 and/or some of the method steps described with references to blocks 252 and 260 may be omitted without departing from the scope of the cell sorting procedure described in the present disclosure. The method steps described with references to blocks 258 and 260 and at least some of the method steps described with references to block 256 may be carried out via operation of a computing apparatus which may be coupled to the measurement arrangement 100 (e.g. the controller 122, the processing unit 125 or any further computing apparatus) or which may be provided separately from the measurement arrangement 100. In the latter scenario, the determination of the impedance curves (cf. block 256) may comprise receiving the respective impedance curves determined for the plurality of cells via operation of the measurement arrangement 100 (or via respective operation of a plurality of measurement arrangements 100) or the determination of the impedance curves may be comprise receiving respective sets of voltages $u_{batt}$ across the terminals of the battery 100 and the electric currents $i_{batt}$ supplied to the adjustable load 121 as a function of time (cf. block 204) and determining the respective impedance curves based on this data (cf. block 206).

The harmonization of the measurement conditions (cf. block 254) may comprise arranging the plurality of cells into a predefined reference voltage that is the same for each of the plurality of cells and adapting the ambient temperature in a location of measurement into a predefined reference temperature. Application of the (same) predefined reference voltage across the plurality of cells and providing the (same) reference temperature ensures obtaining respective impedance curves that are directly comparable to each other even if the measurements for obtaining the respective impedance curves for the plurality of cells are carried out in different locations and/or at different times. According to an example, the plurality of cells may be kept coupled to the reference voltage (preferably at the reference temperature) for a prolonged time period before carrying out the impedance measurement to ensure settling of the cells, where the time period may be within a range from a couple of days to a couple of weeks, e.g. for one week. Such a settling period may be useful in ensuring that the respective impedance curves of the plurality of cells are measured under similar conditions and that any procedures or reactions within the cells have settled after setting the cell voltages to the reference voltage.

The determination of the respective impedance curves for the plurality of cells under consideration (cf. block 256) may advantageously involve applying the impedance measurement technique described in the present disclosure to determine the respective impedance curve for the plurality of cells, whereas in other examples another technique that enables acquiring a respective impedance curve of the kind described in the present disclosure may be applied, such as electrochemical impedance spectroscopy (EIS) or a multi-sine impedance measurement technique. The frequency range represented by the impedance curves may extend, for example, from a fraction of one Hz up to a few kHz, where the lower end of the frequency range may be, for example, in a range from 0.01 to 1 Hz and where the upper end of the frequency range may be, for example, in a range from 4 to 5 kHz. In the following, the frequency range represented by the impedance curve may be also referred to as a frequency range of interest or as a frequency range under consideration. The frequency range represented by the impedance curve may be, at least conceptually, divided into two or more frequency sub-ranges, e.g. into a low frequency sub-range, a middle frequency sub-range and a high frequency sub-range. In a non-limiting example, the following frequency sub-ranges may be considered:
  the low frequency sub-range from 0.01 to 5 Hz,
  the middle frequency sub-range from 5 to 500 Hz,
  the high frequency sub-range from 500 Hz to 5 kHz.

Figure 13A:
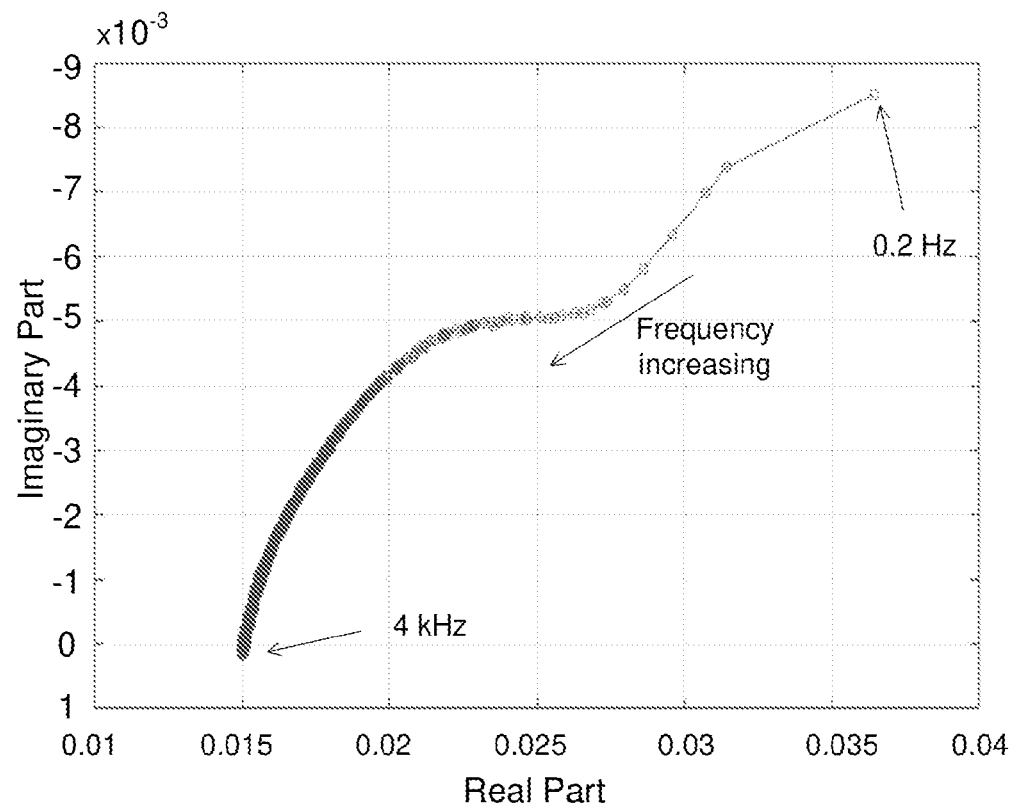
FIG. 13A illustrates an impedance curve according to an example.
Figure 13B:
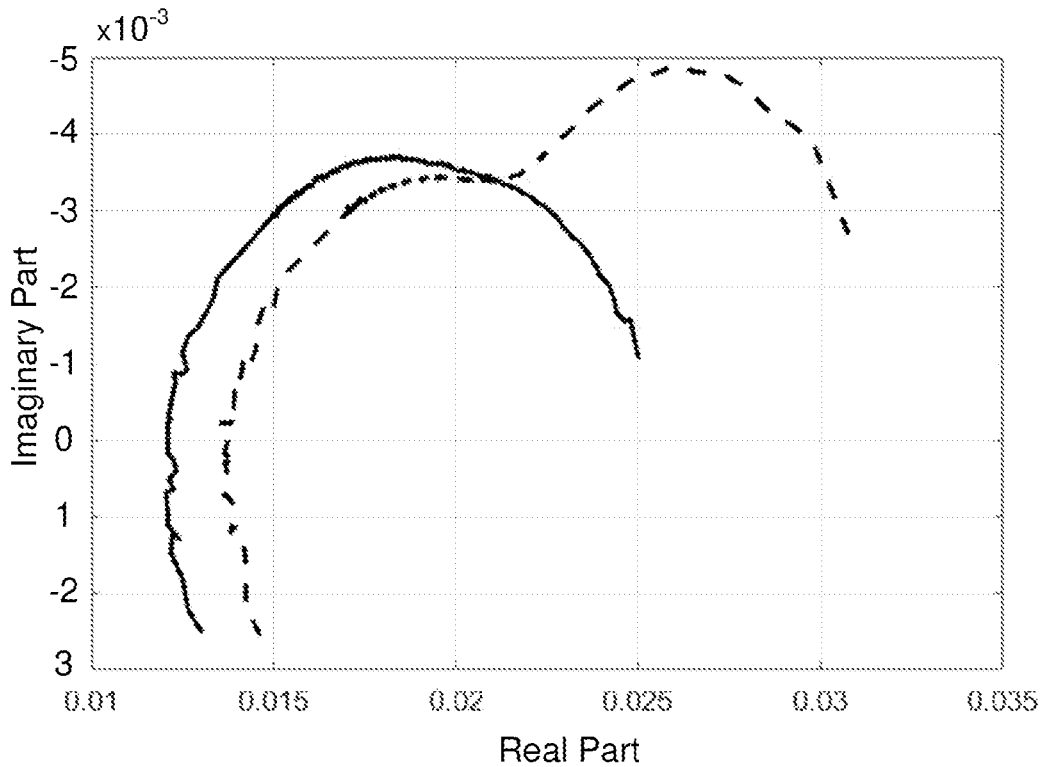
FIG. 13B illustrates two impedance curves according to an example.

Before proceeding to examples of determination of the impedance characteristic (cf. block 258) and sorting the cells (cf. block 260), some general characteristics of the impedance curve (e.g. the electrical fingerprint) are described with references to FIGS. 13A and 13B. Along the lines described in the foregoing, the impedance curve derived for a cell may be presented as a curve in the complex plane, thereby presenting the real part and the imaginary part of the impedance for a plurality of frequency points, where the real part represents resistance of the respective cell and the imaginary part represents the reactance of the respective cell at different frequencies.

As an illustrative example in this regard, FIG. 13A depicts a complex-plane representation of the impedance curve determined for a cell, where the impedance curve covers frequencies from approximately 0.2 Hz to approximately 4 kHz. Certain characteristics of the complex-plane representation of impedance curve may be applied to determine or estimate certain characteristics of a condition of the respective cell in consideration of the underlying cell type, as described in further detail in examples provided in the following.

As another illustrative example, FIG. 13B depicts complex-plane representations of the respective impedance curves determined for two cells of the same cell type: a first impedance curve shown a solid curve represents the internal impedance of a first cell that is in a good condition, whereas a second impedance curve shown a dashed curve represents an internal impedance of a second cell that is likely damaged. For the cell type applied in the example of FIG. 13B, the complex-plane representation of an impedance curve representing the internal impedance of a cell that is in good condition typically has a partially circular overall shape (e.g. a shape resembling a half-circle) approximately at a frequency region from 1 Hz to 1 kHz, whereas the complex-plane representation of an impedance curve representing the internal impedance of a cell that is not in good condition typically rather clearly deviates from such a partially circular shape and/or has the partially circular shape at frequencies outside this frequency region.

In this regard, for many cell types, the complex-plane representation of an impedance curve that represents a cell that is in good condition has a predefined number of partially circular segments within respective predefined frequency regions, where the predefined number of partially circular segments and the respective predefined frequency regions typically depend on the cell type under consideration. In contrast, the complex-plane representation of an impedance curve that represents a cell that is likely damaged has a different number of partially circular segments defined for the cell type under consideration and/or one or more of the partially circular segments appear outside their respective frequency regions defined for the cell type under consideration. In the framework of the present disclosure, a partially circular segment of the complex-plane representation of the impedance curve may be defined a curve segment that approximates a portion of circle e.g. in a range from one quarter of a circle to a half of a circle, where the 'radius' of such a partially circular segment may vary up to 10% over the segment considered as a partially circular one. In the literature (such as academic publications) in this field of technology, partially circular segments of the kind described herein are commonly referred to as semicircles, even though these segments typically do not strictly constitute a segment of a circle and/or do not approximate exactly a half of a circle.

Further in this regard, in case the complex-plane representation of the impedance curve includes two or more partially circular segments, these segments may be separate from each other or they may be partially overlapping. Moreover, a partially circular segment appearing at relatively low frequencies (e.g. within the low frequency sub-range) may not be fully included in the complex-plane representation the impedance due to the partially circular segment extending to low frequencies that are outside the frequency range represented by the impedance curve.

Some characteristics of an impedance curve may also serve to indicate certain characteristics of a voltage response of the respective cell. In general, the voltage response of a cell to a current pulse supplied thereto typically commences with a higher initial voltage that gradually reduces to a lower baseline voltage. As an example of characteristics of the impedance curve that are indicative of the cell condition, the inventors have observed the following relationships between characteristics of the impedance curve and the above-described voltage response: a lower minimum impedance within the frequency range represented by the impedance curve implies a smaller instant voltage drop in response to the current pulse (and vice versa), whereas a lower impedance at the low-frequency end of the impedance curve implies a higher baseline voltage in response to the current pulse. Hence, in the example of FIG. 13B the lower impedance minimum in the high-frequency portion of the first impedance curve (in comparison to that of the second impedance curve) suggests that the first cell responds to the current pulse with a smaller voltage drop than the second cell and the lower impedance at the low-frequency end of the first impedance curve (in comparison to that of the second impedance curve) suggest that the first cell responds to the current pulse with a higher baseline voltage than the second cell. Such differences in the respective voltage responses of the first and second cell renders them unsuited for being coupled in parallel as part of a second-life battery, because the different voltage responses would result in different currents through the first and second cells, which in turn is found to be detrimental for the capacity of the second-life battery over repeated charging-discharging cycles.

Referring back to the aspect of determining the one or more impedance characteristics based on the impedance curve (cf. block 258), non-limiting examples of applicable impedance characteristics include the following:

the number of partially circular segments in the complex-plane representation of the impedance curve;
respective frequency sub-ranges at which the partially circular segments in the complex-plane representation of the impedance curve appear;
elevated imaginary part of the complex-plane representation of the impedance curve at low frequencies;
frequencies at which local minima and/or local maxima of the impedance appear;
respective minima and/or maxima of the resistance within one or more frequency sub-ranges;
respective minima and/or maxima of the reactance within one or more frequency sub-ranges;
impedance as a function of frequency;
an overall shape of the complex-plane representation of the impedance curve;
respective diameters of the partially circular segments in the complex-plane representation of the impedance curve.

Each of the impedance characteristics described above may be considered across the frequency range of interest in its entirety or they may be considered separately in one or more frequency sub-ranges, e.g. in one or more of the low frequency sub-range, the middle frequency sub-range and the high frequency sub-range. Some of the above-discussed impedance characteristics may have a different relationship with the cell condition for different cell types, whereas some (others) of the above-discussed impedance characteristics may have the same or similar relationship with the cell condition regardless of the cell type.

Referring back to the aspect of sorting the plurality of cells into the one or more cell quality classes (cf. block 260), the sorting may comprise assigning each of the cells into one of a first cell quality class or a second cell quality class in accordance with the one or more impedance characteristics determined for the respective cell. In this regard, the cells assigned to the first cell quality class may be ones that are applicable for further use, whereas the cells assigned to the second cell quality class may be ones that not applicable for further use. Consequently, the cells assigned to the first quality class may be applied as building blocks for one or more 'second-life' batteries, whereas the cells assigned to the second quality class may be discarded and/or their materials may be recycled. In further examples, the cells assigned to the first cell quality class may be further assigned to two or more quality sub-classes and/or a group of cells from the first quality class may be chosen as building blocks of a second-life battery, as described in the examples provided in the following.

In an example, the aspect of sorting the plurality of cells (cf. block 260) may comprise assigning a cell under consideration into the first or second cell quality class in consideration of one or more qualification criteria and/or one or more disqualification criteria that pertain to one or more impedance characteristics applied in the sorting. In particular, this may comprise one or more of the following:

assigning the cell under consideration into the first cell quality class (e.g. designating the respective cell as a cell that is suitable for further use) in response to the one or more impedance characteristics derived for the respective cell meeting the one or more qualification criteria and assigning the cell under consideration into the second cell quality class (e.g. designating the respective cell as a cell to be discarded or its materials to be recycled) in response to the one or more impedance characteristics derived for the respective cell failing to meet the one or more qualification criteria;

assigning the cell under consideration into the second cell quality class in response to the one or more impedance characteristics derived for the respective cell meeting the one or more disqualification criteria and assigning the cell under consideration into the first cell quality class in response to the one or more impedance characteristics derived for the respective cell failing to meet the one or more disqualification criteria.

As an example, for a certain cell type one or more qualification criteria may set requirements for the number of partially circular segments in the complex-plane representation of the impedance curve, possibly together with respective frequency sub-ranges within which they appear (e.g. respective one(s) of the low frequency sub-range, the middle frequency sub-range and the high frequency sub-range). Hence, in an example, application of the one or more qualification criteria may comprise assigning a cell under consideration into the first quality class in response to the number of partially circular segments in the complex-plane representation of the impedance curve being equal to a predefined reference number of partially circular segments and the partially circular segments appearing within respective predefined frequency sub-ranges. Conversely, application of the one or more qualification criteria may comprise assigning the cell under consideration into the second cell quality class in response to the number of partially circular segments in the complex-plane representation of the impedance curve being different from the predefined reference number of partially circular segments and/or in response to at least one of partially circular segments in the complex-plane representation of the impedance curve appearing outside its respective frequency sub-range.

In a non-limiting example in this regard, for a certain cell type, presence of a single partially circular segment in the complex-plane representation of the impedance curve (regardless of its position within the frequency range represented by the impedance curve) has been found to suggest a good-quality cell, whereas presence of two or more or more partially circular segments has been found to suggest a high likelihood of self-discharge of the respective cell, which typically makes the respective cell unsuited for further use. Consequently, the one or more qualification criteria may require that there is exactly one partially circular segment that may appear anywhere within the frequency range of interest. In other non-limiting examples, the one or more qualification criteria may require that there is exactly one partially circular segment and it appears in the middle frequency sub-range or the one or more qualification criteria may require that there are two partially circular segments, where one of the partially circular segments appears in the middle frequency sub-range and the other one appears in the low frequency sub-range.

In this regard, the number of partially circular segments may be determined, for example, via determining the number of zero-crossings in the first derivative of the imaginary part of the impedance curve determined for the respective cell: each zero crossing of the first derivative suggests a local maximum or a local minimum of the imaginary part and, consequently, a single zero crossing suggest presence of a single partially circular segment, two or three zero crossings suggests presence of two partially circular segments, four or five zero crossings suggests presence of three partially circular segments, etc. Hence, e.g. one zero crossing may be considered to indicate presence of a single partially circular segment in the impedance curve (e.g. as in the first impedance curve of FIG. 13B shown as solid curve), whereas two or more zero crossings may be considered to indicate presence of more than one partially circular segment in the impedance curve (e.g. as in the second impedance curve of FIG. 13B shown as dashed curve).

In another example, the one or more disqualification criteria may set requirements for the shape of the impedance curve at a low frequency portion of the complex-plane representation of the impedance curve. As an example in this regard, application of the one or more disqualification criteria may comprise assigning a cell under consideration into the second quality class in response to observing an elevated imaginary part in the complex-plane determination impedance curve at low frequencies, which suggests capacitance that is high in relation to the resistance at the low frequencies. Conversely, application of the one or more disqualification criteria may comprise assigning the cell under consideration into the first cell quality class in response to not observing an elevated imaginary part in the complex-plane determination impedance curve at low frequencies. In this regard, a high reactance in relation to the resistance at the low frequencies has been found to suggest a very high likelihood of self-discharge of the respective cell, which typically makes the respective cell unsuited for further use. Assignment of the cell under consideration to the second quality class may occur e.g. in response to the imaginary part of the complex-plane representation of the impedance curve exceeding a reference level at frequencies below a predefined threshold frequency, where the predefined threshold frequency may be chosen from a range from 0.01 Hz to 2 Hz, e.g. 0.5 Hz. In this regard, the reference level may be defined as a single reference value (which is applicable for all frequencies below the threshold frequency) or as a reference curve that defines reference value as a function of frequency (below the threshold frequency). In an example, the reference level may be defined as an absolute value, whereas in another example the reference level may be defined in relation to a predefined portion of the imaginary part of the complex-plane representation of the impedance curve at frequencies below the threshold frequency, e.g. in relation to the maximum or minimum of the complex-plane representation of the imaginary part of the impedance curve at frequencies above threshold frequency.

Along the lines described in the foregoing, in an example, the aspect of sorting the plurality of cells into the one or more cell quality classes (cf. block 260) may further comprise or it may be followed by (further) assigning the cells assigned into the first quality class (i.e. as cells that is suitable for secondary use) into one of two or more cell quality sub-classes based on the one or more impedance characteristics under consideration. The purpose of the assignment to the one or more cell quality sub-classes is to identify respective sets of cells that are substantially similar to each other e.g. in terms of one or more of the following characteristics:
  (remaining) energy capacity of the cells,
  voltage responses of the cells to a current pulse,
  heat generation rate (or heating rate) of the cells upon charging and/or discharging,
  self-discharge rate of the cells,
  expected battery life of the cells in terms of the number of charge-discharge cycles,
  a risk for short-circuit of the cells.

While dedicated measurements for determination of the above-mentioned aspects of the cells would require substantial resources and time, the assignment into the cell quality sub-classes in a manner that accounts for the above-mentioned cell characteristics may be carried out via a classification that is based on the applicable impedance characteristics derived for the cells under consideration.

Since the most relevant impedance characteristics may vary from one cell type to another, the choice of the impedance characteristics considered in the classification may be made in dependence of the cell type under consideration.

In this regard, the impedance characteristics under consideration may comprise one or more of the following:
  frequencies at which the local minima and/or the local maxima of the impedance appear,
  the respective minima and/or maxima of the resistance within one or more frequency sub-ranges,
  the respective minima and/or maxima of the reactance within one or more frequency sub-ranges,
  the impedance as a function of frequency,
  the overall shape of the complex-plane representation of the impedance curve,
  the respective diameters of the partially circular segments in the complex-plane representation of the impedance curve.

The classification may at least partially rely on a reference impedance curve (e.g. a reference fingerprint) for the cell type under consideration, where the reference impedance curve may be obtained based on impedance curves determined for one or more reference cells of the respective cell type. In this regard, the one or more reference cells may be unused cells of the respective cell type or used cells of the respective cell type that are found, based on measurements carried out therefor, to be in good condition. In particular, the reference impedance curve may be represented by respective one or more reference impedance characteristics derived based on the reference impedance curve and, consequently, the classification of a certain cell may be carried out via comparison of the applied one or more impedance characteristics derived for the respective cell to the respective one or more reference impedance characteristic in consideration of one or more cell classification criteria that pertain to differences between the impedance characteristics derived for the respective cell and the respective reference impedance characteristics.

In an example, the classification may be carried out in consideration of one or more first cell classification criteria for classifying a cell under consideration to a first cell quality sub-class and the classification may be carried out in the following manner:
  in case differences between the impedance characteristics derived for the cell under consideration and the respective reference impedance characteristics meet the one or more first cell classification criteria, the respective cell is classified into the first cell quality sub-class;
  in case the differences between the impedance characteristics derived for the cell under consideration and the respective reference impedance characteristics fail to meet the one or more first cell classification criteria, the respective cell is not classified into the first cell quality sub-class (but it may be classified into another cell quality sub-class).

Consequently, the above-described classification into the first and second cell quality sub-classes may be applicable for dividing the cells under consideration into ones whose condition is similar or close to that of the one or more reference cells and into ones that are not in quite as good condition (but that are still applicable for further use).

The above-described classification readily extends to further classifying the cells that are not classified into the first cell quality sub-class into the second cell quality sub-class in consideration of one or more second cell classification criteria for classifying a cell under consideration to the second cell quality sub-class in the manner described above for classification of the cell into the first cell quality sub-class, mutatis mutandis. Moreover, the classification may still be extended to consider classification of cells that are not classified into the first or second cell quality sub-classes into respective further cell quality sub-classes in consideration of respective one or more cell classification criteria, mutatis mutandis.

Along the lines described in the foregoing, in an example, the aspect of sorting the plurality of cells into the one or more cell quality classes (cf. block 260) may further comprise or it may be followed by forming one or more cell groups from the cells assigned into the first cell quality class (i.e. as cells that is suitable for secondary use) for application as building blocks of a respective second-life battery. The formation of the one or more cell groups may be carried out in accordance with the one or more impedance characteristics determined for the cells of the first cell quality group, such that each cell group includes a number of cells that are similar to each other in terms of the one or more impedance characteristics determined therefor. In this regard, it is important to build a second-life battery using cells that are as similar to each other as possible in in their condition and characteristics and, consequently, the aim of forming the one or more cell groups in such a manner is to determine cell groups within which the cells are substantially similar to each other e.g. in terms of one or more of the following characteristics:

(remaining) energy capacity of the cells,
voltage responses of the cells to a current pulse,
heat generation rate (or heating rate) of the cells upon charging and/or discharging,
self-discharge rate of the cells,
expected battery life of the cells in terms of the number of charge-discharge cycles,
a risk for short-circuit of the cells.

In an example, the formation of the one or more cell groups may involve forming a first cell group via selecting, from the cells assigned to the first cell quality class, a number of cells that are similar to each other in terms of the one or more impedance characteristics determined therefor. Formation of the first cell group may be followed by formation of a second and possibly subsequent cell groups of similar kind. In another example, the formation of the one or more cell groups may involve applying a clustering algorithm known in the art to divide the cells assigned to the first cell quality class into the one or more cell groups such that in each cell group includes a number of cells that are similar to each other in terms of the one or more impedance characteristics determined therefor.

Along the lines described in the foregoing, the most relevant impedance characteristics may vary from one cell type to another and, consequently, the choice of the impedance characteristics considered in formation of the one or more cell groups may be made in dependence of the cell type under consideration. The impedance characteristics considered in forming the one or more cell groups may comprise at least one of the following:
frequencies at which the local minima and/or the local maxima of the impedance appear,
the respective minima and/or maxima of the resistance within one or more frequency sub-ranges,
the respective minima and/or maxima of the reactance within one or more frequency sub-ranges,
the impedance as a function of frequency,
the overall shape of the complex-plane representation of the impedance curve,
the respective diameters of the partially circular segments in the complex-plane representation of the impedance curve.

While any (sub-)combination of the impedance characteristics described above may be applied as the basis for forming the one or more cell groups, an example of an impedance characteristic of particular importance comprises the impedance as a function of frequency, either over the frequency range covered by the impedance curve in its entirety or at frequencies below a predefined threshold frequency, where the threshold frequency may be chosen from a range from 0.01 to 5 Hz, e.g. 1 Hz. The impedance at the lowest frequencies (i.e. below the threshold frequency) may be particularly important since the second-life battery is typically applied to supply direct current (DC) and, consequently, using cells that have substantially matching impedances especially at the lowest frequencies as building blocks of the second-life battery contributes towards safe and stable operation of the second-life battery. As an example, similarity (or difference) between respective impedances determined for two cells under consideration may be determined as a mean squared error (MSE) between the respective impedance curves in their respective portions that represent the frequency range under consideration.

Another example of an impedance characteristic of particular importance involves the respective diameters of the partially circular segments in the complex-plane representation of the impedance curve. In this regard, for certain cell types, the respective diameters of the partially circular segments may serve as an indication of the remaining energy capacity of the respective cell and, consequently, substantially matching diameters determined for a number of cells suggests substantially similar remaining energy capacities for these cells.

The impedance characteristic under consideration in forming the cell groups may be selected in dependence of whether the respective cells are intended for being connected in parallel or intended for being connected in series when applied as the building blocks of the second-life battery. Matching of impedances between the cells intended to serve as the building blocks for the same second-life battery may be especially important for an arrangement where the respective cells are intended for being connected in parallel to each other to ensure substantially similar voltage response by each of the cells, thereby avoiding a scenario where the respective currents through the cells connected in parallel would be different and, consequently, the current might flow from one cell to another and/or where some of the cells would be heated more than some others.

For a scenario where the respective cells are intended for being connected in series, the matching of impedances may of smaller importance while an important aspect may be finding a group of cells having substantially matching (remaining) capacity, which facilitates the cells remaining in substantially similar voltage and, consequently, avoids degrading performance of the second-life battery e.g. due to the voltage of one of the series-connected cells falling to a level that results in the battery management system (BMS) of the second-life battery discontinuing operation of the battery'.

In the foregoing, the sorting procedure according to the method 250 is described with references examples that pertain to impedances measured for individual cells and to subsequent sorting of the individual cells. In other examples, the sorting procedure according to the method 250 may be applied to cell modules, where (instead of an individual cell) each cell module comprises a cell assembly of two or more cells arranged in series, in parallel, or in a mixture thereof.

Figure 14:
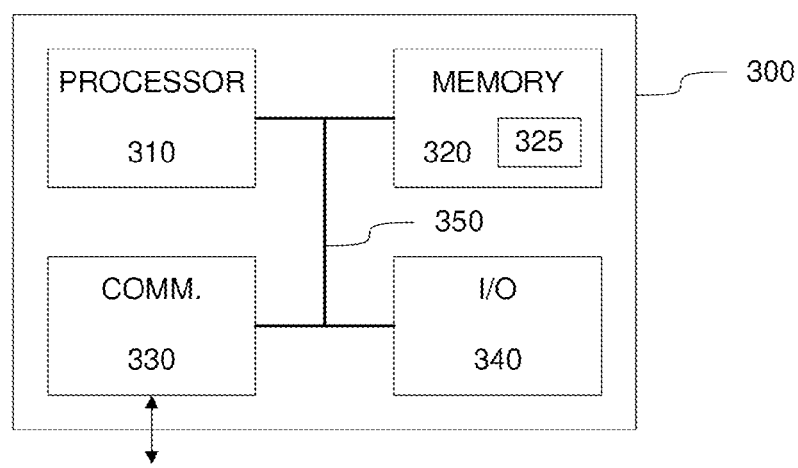
FIG. 14 illustrates a block diagram of some components of an apparatus according to an example.

Referring back to the controller 122, FIG. 14 illustrates a block diagram of some components of an apparatus 300 that may be employed to implement at least some aspects of the method 200 and/or the method 250 described in the foregoing. Although described herein with references to a single apparatus 300, the at least some aspects of the method 200 and/or the method 250 described in the foregoing may be implemented via joint operation of two or more apparatuses 300 arranged to provide a cloud-based computing service.

The apparatus 300 comprises a processor 310 and a memory 320. The memory 320 may store data and computer program code 325. The apparatus 300 may further comprise communication means 330 for wired or wireless communication with other apparatuses and/or user I/O (input/output) components 340 that may be arranged, together with the processor 310 and a portion of the computer program code 325, to provide the user interface for receiving input from a user and/or providing output to the user. In particular, the user I/O components may include user input means, such as one or more keys or buttons, a keyboard, a touchscreen or a touchpad, etc. The user I/O components may include output means, such as a display or a touchscreen. The components of the apparatus 300 are communicatively coupled to each other via a bus 350 that enables transfer of data and control information between the components.

The memory 320 and a portion of the computer program code 325 stored therein may be further arranged, with the processor 310, to cause the apparatus 300 to perform at least some aspects of the method 200 and/or the method 250. The processor 310 is configured to read from and write to the memory 320. Although the processor 310 is depicted as a respective single component, it may be implemented as respective one or more separate processing components. Similarly, although the memory 320 is depicted as a respective single component, it may be implemented as respective one or more separate components, some or all of which may be integrated/removable and/or may provide permanent/semi-permanent/dynamic/cached storage.

The computer program code 325 may comprise computer-executable instructions that implement at least some aspects of the method 200 and/or the method 250 described in the foregoing when loaded into the processor 310. As an example, the computer program code 325 may include a computer program consisting of one or more sequences of one or more instructions. The processor 310 is able to load and execute the computer program by reading the one or more sequences of one or more instructions included therein from the memory 320. The one or more sequences of one or more instructions may be configured to, when executed by the processor 310, cause the apparatus 300 to perform at least some aspects of the method 200 and/or the method 250 described in the foregoing. Hence, the apparatus 300 may comprise at least one processor 310 and at least one memory 320 including the computer program code 325 for one or more programs, the at least one memory 320 and the computer program code 325 configured to, with the at least one processor 310, cause the apparatus 300 to perform at least some aspects of respective operation of the method 200 and/or the method 250 described in the foregoing.

The computer program code 325 may be provided e.g. as a computer program product comprising at least one computer-readable non-transitory medium having the computer program code 325 stored thereon, which computer program code 325, when executed by the processor 310 causes the apparatus 300 to perform at least some aspects of respective operation of the method 200 and/or the method 250 described in the foregoing. The computer-readable non-transitory medium may comprise a memory device or a record medium that tangibly embodies the computer program. As another example, the computer program may be provided as a signal configured to reliably transfer the computer program.

Reference(s) to a processor herein should not be understood to encompass only programmable processors, but also dedicated circuits such as field-programmable gate arrays (FPGA), application specific circuits (ASIC), signal processors, etc. Features described in the preceding description may be used in combinations other than the combinations explicitly described.

The following numbered clauses define some non-limiting example embodiments that pertain to measurement of the internal impedance of the battery 110, the internal impedance of a cell module of the battery 110 or the internal impedance of an individual cell of the battery 110, whereas the scope of protection is defined in the claims provided in the following.

Clause 1: An apparatus (120) for measuring an internal impedance of a rechargeable battery (110), the apparatus (122) comprising:
an adjustable load (121, 131, 131', 141) for coupling between terminals of the rechargeable battery (110); and
a controller (122) arranged to:
set an impedance of the adjustable load (121, 131, 131', 141) to one of two or more predefined values according to a switching sequence that defines switching between said two or more predefined values as a function of time, so as to supply pulsed current to the adjustable load (121, 131, 131', 141),
obtain respective indications of a voltage across terminals of the rechargeable battery (110) and an electric current supplied to the adjustable load (121, 131, 131', 141) as a function of time, and derive the internal impedance of the rechargeable battery (110) on basis of said voltage and said electric current.

Clause 2: An apparatus (120) according to clause 1, wherein the adjustable load (120, 131, 131', 141) is provided for being connected between terminals of the rechargeable battery (110) so as to generate the electric current using an internal charge of the rechargeable battery (110).

Clause 3: An apparatus (120) according to clause 1 or 2, wherein
the changes between said two or more predefined values defined via the switching sequence represent a predefined frequency range, and the apparatus (120) is arranged to derive the internal impedance of the rechargeable battery (100) as a function of frequency in view of said predefined frequency range.

Clause 4: An apparatus (120) according to any of clauses 1 to 3, wherein
the adjustable load (121, 131, 131') comprises one or more current paths therethrough, each current path having a respective impedance ($Z_0$, $Z_1$, $Z_2$) and a respective switch ($S_0$, $S_1$, $S_2$) arranged in series, and
the controller (122) is arranged to set the impedance of the adjustable load (121, 131, 131') via selectively opening and closing said one or more switches ($S_0$, $S_1$, $S_2$) in accordance with a respective control sequence that determines switching between open and closed states of the respective switch ($S_0$, $S_1$, $S_2$) as a function of time.

Clause 5: An apparatus according to clause 4, wherein the adjustable load (131) comprises a single current path including an impedance ($Z_0$) arranged in series with a switch ($S_0$).

Clause 6: An apparatus according to clause 4, wherein the adjustable load (131') comprises a first current path and a second current path arranged in parallel, wherein the first current path comprises a first impedance ($Z_1$) arranged in series with a first switch ($S_1$) and the second current path comprises a second impedance ($Z_2$) arranged in series with a second switch ($S_2$).

Clause 7: An apparatus according to clause 4, wherein
the adjustable load (141) comprises a current path including a transistor ($T_L$), and
the controller (122) is arranged to regulate the electric current through the transistor ($T_L$) in accordance with a control sequence that determines an impedance to be applied via operation of the transistor ($T_L$) as a function of time.

Clause 8: An apparatus (120) according to any of clauses 3 to 7, wherein respective one of the switching sequence and/or the respective control sequence comprises a multi-frequency pseudo-random pulse sequence, PRPS, that represents a plurality of frequency components at a predefined frequency resolution ($f_{res}$).

Clause 9: An apparatus (120) according to clause 8, wherein the multi-frequency PRPS comprises one of the following:

a multi-frequency pseudo-random binary sequence, PRBS,
a multi-frequency pseudo-random ternary sequence, PRTS.

10. A system for measuring an internal impedance of a rechargeable battery (110), the system comprising:
an adjustable load (121, 131, 131', 141) for coupling between terminals of the rechargeable battery (110);
a controller (122) arranged to:
set an impedance of the adjustable load (121, 131, 131', 141) to one of two or more predefined values according to a switching sequence that defines switching between said two or more predefined values as a function of time, so as to supply pulsed current to the adjustable load (121, 131, 131', 141), and
obtain respective indications of a voltage across terminals of the rechargeable battery (110) and an electric current supplied to the adjustable load (121, 131, 131', 141) as a function of time; and a processing unit (125) arranged to derive the internal impedance of the rechargeable battery (110) on basis of said voltage and said electric current.

Clause 11: A measurement arrangement (100) for measuring an internal impedance of a rechargeable battery (110), the arrangement (100) comprising:
an apparatus (120) according to any of clauses 1 to 9 or a system according to claim 10; and
the rechargeable battery (110),
wherein the adjustable load (121, 131, 131', 141) is connected between terminals of the rechargeable battery (110) so as to generate the electric current using an internal charge of the rechargeable battery (110).

Clause 12: A method (200) for measuring an internal impedance of a rechargeable battery (110), the method (200) comprising:
setting (202) an impedance of an adjustable load (121, 131, 131', 141) coupled between terminals of the rechargeable battery (110) to one of two or more predefined values according to a switching sequence that defines switching between said two or more predefined values as a function of time, so as to supply pulsed current to the adjustable load (121, 131, 131', 141);
obtaining (204) respective indications of a voltage across the terminals of the rechargeable battery (110) and an electric current supplied to the adjustable load (121, 131, 131', 141) as a function of time; and
deriving (206) the internal impedance of the rechargeable battery (110) on basis of said voltage and said electric current.

Clause 13: A computer program (325) for measuring an internal impedance of a rechargeable battery (110), the computer program (325) comprising computer readable program code configured to cause performing at least the following when said program code is executed on one or more computing apparatuses (300):
set an impedance of an adjustable load (121, 131, 131', 141) coupled between terminals of the rechargeable battery (110) to one of two or more predefined values according to a switching sequence that defines switching between said two or more predefined values as a function of time, so as to supply pulsed current to the adjustable load (121, 131, 131', 141),
obtain respective indications of a voltage across the terminals of the rechargeable battery (110) and an electric current supplied to the adjustable load (121, 131, 131', 141) as a function of time; and derive the internal impedance of the rechargeable battery (110) on basis of said voltage and said electric current.

The invention claimed is:
1. A method comprising:
determining, by a measurement arrangement comprising an impedance measurement assembly, a respective impedance curve for a plurality of cells extracted from a plurality of rechargeable batteries, wherein the impedance measurement assembly comprises a controller and an adjustable load, wherein each impedance curve is descriptive of an internal impedance of the respective cell as a function of frequency over a predefined frequency range, derived via the following procedure:
setting, by the controller, an impedance of the adjustable load coupled between terminals of the respective cell between two or more predefined values according to a multi-frequency pseudo-random pulse sequence (PRPS) that represents a plurality of frequency components at a predefined frequency resolution within the predefined frequency range and that defines switching between said two or more predefined values as a function of time, and
deriving, by the controller, the internal impedance of the respective cell over the predefined frequency range based on a voltage across the terminals of the respective cell and an electric current supplied to the adjustable load as a function of time;
determining, by the impedance measurement assembly, for each of the plurality of cells, respective one or more impedance characteristics based on the impedance curve determined for the respective cell, wherein said one or more impedance characteristics for a given cell comprise an indication of the number of partially circular segments appearing in a complex-plane representation of the impedance curve determined for the respective cell and respective frequency sub-ranges within which said partially circular segments appear;
sorting, by the controller or a computing apparatus operably coupled to the measurement arrangement, the plurality of cells into one of a first quality class or a second quality class in accordance with the one or more impedance characteristics determined for the plurality of cells; and
selecting, by the controller or the computing apparatus operably coupled to the measurement arrangement, a set of the plurality of cells sorted into the first quality class for one or more batteries,
wherein said sorting comprises at least one of the following:
applying one or more qualification criteria, comprising assigning a cell into a first cell quality class in response to the one or more impedance characteristics derived for the respective cell meeting the one or more qualification criteria and assigning the cell into the second cell quality class in response to said one or more impedance characteristics failing to meet the one or more qualification criteria;
applying one or more disqualification criteria, comprising assigning a cell into the first cell quality class in response to the one or more impedance characteristics derived for the respective cell failing to meet the one or more disqualification criteria and assigning the cell into the second cell quality class in response to said one or more impedance characteristics meeting the one or more disqualification criteria.

2. The method according to claim 1, wherein
said sorting comprises assigning the respective cell into the first cell quality class in response to said number of partially circular segments being equal to a predefined reference number of partially circular segments and the partially circular segments appearing within respective predefined frequency sub-ranges and assigning the respective cell into the second cell quality class otherwise.

3. The method according to claim 1, wherein
the one or more impedance characteristics determined for a cell comprises an indication of one of presence or absence of an elevated imaginary part in a complex-plane representation of the impedance curve determined for the respective cell at frequencies below a threshold frequency, and
said sorting comprises assigning the respective cell into the first cell quality class in response to determining absence of said elevated imaginary part and assigning the respective cell into the second cell quality class in response to determining presence of said elevated imaginary part.

4. The method according to claim 1, further comprising:
further assigning those cells that are assigned into the first cell quality class into one of two or more cell quality sub-classes in accordance with the one or more impedance characteristics determined for the plurality of cells in consideration of respective one or more reference impedance characteristics that represent a reference impedance curve.

5. The method according to claim 4, wherein
assigning a cell into a first cell quality sub-class in response to differences between the one or more impedance characteristics determined for the respective cell and the respective one or more reference impedance characteristics meeting one or more cell classification criteria, and
assigning a cell into another cell quality sub-class in response to differences between the one or more impedance characteristics determined for the respective cell and the respective one or more reference impedance characteristics failing to meet the one or more cell classification criteria.

6. The method according to claim 1, further comprising:
forming one or more cell groups from those cells that are assigned into the first cell quality class such that each cell group includes a number of cells that are similar to each other in terms of the one or more impedance characteristics determined therefor.

7. The method according to claim 4, wherein the one or more impedance characteristics comprise at least one of the following:
frequencies at which local minima of the impedance appear,
frequencies at which local maxima of the impedance appear,
respective minima of resistance within one or more frequency sub-ranges,
respective maxima of resistance within one or more frequency sub-ranges,
respective minima of reactance within one or more frequency sub-ranges,
respective maxima of reactance within one or more frequency sub-ranges,
impedance as a function of frequency,
an overall shape of a complex-plane representation of the impedance curve,
respective diameters of partially circular segments in the complex-plane representation of the impedance curve.

8. The method according to claim 1, wherein the multi-frequency PRPS comprises one of the following:
a multi-frequency pseudo-random binary sequence (PRBS),
a multi-frequency pseudo-random ternary sequence (PRTS).

9. An apparatus comprising:
a measurement arrangement comprising an impedance measurement assembly, wherein the impedance measurement assembly comprises a controller and an adjustable load, wherein
the measurement arrangement is configured to determine a respective impedance curve for a plurality of cells extracted from a plurality of rechargeable batteries, wherein each impedance curve is descriptive of an internal impedance of the respective cell as a function of frequency over a predefined frequency range, wherein the apparatus is arranged to carry out the following to derive the internal impedance of the respective cell:
set, by the controller, an impedance of the adjustable load coupled between terminals of the respective cell between two or more predefined values according to a multi-frequency pseudo-random pulse sequence (PRPS) that represents a plurality of frequency components at a predefined frequency resolution within the predefined frequency range and that defines switching between said two or more predefined values as a function of time, and
derive, by the controller, the internal impedance of the respective cell over the predefined frequency range based on a voltage across the terminals of the respective cell and an electric current supplied to the adjustable load as a function of time;
determine, by the impedance measurement assembly, for each of the plurality of cells, respective one or more impedance characteristics based on the impedance curve determined for the respective cell, wherein said one or more impedance characteristics for a given cell comprise an indication of the number of partially circular segments appearing in a complex-plane representation of the impedance curve determined for the respective cell and respective frequency sub-ranges within which said partially circular segments appear;
sort, by the controller, the plurality of cells into one of a first quality class or a second quality class in accordance with the one or more impedance characteristics determined for the plurality of cells; and
select, by the controller, a set of the plurality of cells sorted into the first quality class for one or more batteries,
wherein said sorting comprises at least one of the following:
applying one or more qualification criteria, comprising assigning a cell into a first cell quality class in response to the one or more impedance characteristics derived for the respective cell meeting the one or more qualification criteria and assigning the cell into the second cell quality class in response to said one or more impedance characteristics failing to meet the one or more qualification criteria;
applying one or more disqualification criteria, comprising assigning a cell into the first cell quality class in response to the one or more impedance characteristics derived for the respective cell failing to meet the one or more disqualification criteria and assigning the cell into the second cell quality class in response to said one or more impedance characteristics meeting the one or more disqualification criteria.

10. A method comprising:
determining, by a measurement arrangement comprising an impedance measurement assembly, a respective impedance curve for a plurality of cells extracted from a plurality of rechargeable batteries, wherein the impedance measurement assembly comprises a controller and an adjustable load, wherein each impedance curve is descriptive of an internal impedance of the respective cell as a function of frequency over a predefined frequency range, derived via the following procedure:
  setting, by the controller, an impedance of the adjustable load coupled between terminals of the respective cell between two or more predefined values according to a multi-frequency pseudo-random pulse sequence (PRPS) that represents a plurality of frequency components at a predefined frequency resolution within the predefined frequency range and that defines switching between said two or more predefined values as a function of time, and
  deriving, by the controller, the internal impedance of the respective cell over the predefined frequency range based on a voltage across the terminals of the respective cell and an electric current supplied to the adjustable load as a function of time;
determining, by the impedance measurement assembly, for each of the plurality of cells, respective one or more impedance characteristics based on the impedance curve determined for the respective cell, wherein said one or more impedance characteristics for a given cell comprise the following:
  an indication of the number of partially circular segments appearing in a complex-plane representation of the impedance curve determined for the respective cell and respective frequency sub-ranges within which said partially circular segments appear, and
  an indication of one of presence or absence of an elevated imaginary part in a complex-plane representation of the impedance curve determined for the respective cell at frequencies below a threshold frequency;
sorting, by the controller or a computing apparatus operably coupled to the measurement arrangement, the plurality of cells into one of a first quality class or a second quality class in accordance with the one or more impedance characteristics determined for the plurality of cells, wherein said sorting comprises assigning the respective cell into the first cell quality class in response to determining absence of said elevated imaginary part and assigning the respective cell into the second cell quality class in response to determining presence of said elevated imaginary part; and
selecting, by the controller or the computing apparatus operably coupled to the measurement arrangement, a set of the plurality of cells sorted into the first quality class for one or more batteries.

11. A method comprising:
determining, by a measurement arrangement comprising an impedance measurement assembly, a respective impedance curve for a plurality of cells extracted from a plurality of rechargeable batteries, wherein the impedance measurement assembly comprises a controller and an adjustable load, wherein each impedance curve is descriptive of an internal impedance of the respective cell as a function of frequency over a predefined frequency range, derived via the following procedure:
  setting, by the controller, an impedance of the adjustable load coupled between terminals of the respective cell between two or more predefined values according to a multi-frequency pseudo-random pulse sequence (PRPS) that represents a plurality of frequency components at a predefined frequency resolution within the predefined frequency range and that defines switching between said two or more predefined values as a function of time, and
  deriving, by the controller, the internal impedance of the respective cell over the predefined frequency range based on a voltage across the terminals of the respective cell and an electric current supplied to the adjustable load as a function of time;
determining, by the impedance measurement assembly, for each of the plurality of cells, respective one or more impedance characteristics based on the impedance curve determined for the respective cell, wherein said one or more impedance characteristics for a given cell comprise an indication of the number of partially circular segments appearing in a complex-plane representation of the impedance curve determined for the respective cell and respective frequency sub-ranges within which said partially circular segments appear;
sorting, by the controller or a computing apparatus operably coupled to the measurement arrangement, the plurality of cells into one of a first quality class or a second quality class in accordance with the one or more impedance characteristics determined for the plurality of cells and further assigning those cells that are assigned into the first cell quality class into one of two or more cell quality sub-classes in accordance with the one or more impedance characteristics determined for the plurality of cells in consideration of respective one or more reference impedance characteristics that represent a reference impedance curve, wherein said further assigning comprising
  assigning a cell into a first cell quality sub-class in response to differences between the one or more impedance characteristics determined for the respective cell and the respective one or more reference impedance characteristics meeting one or more cell classification criteria, and
  assigning a cell into another cell quality sub-class in response to differences between the one or more impedance characteristics determined for the respective cell and the respective one or more reference impedance characteristics failing to meet the one or more cell classification criteria; and
selecting, by the controller or the computing apparatus operably coupled to the measurement arrangement, a set of the plurality of cells sorted into the first quality class for one or more batteries.

12. A method comprising:
determining, by a measurement arrangement comprising an impedance measurement assembly, a respective impedance curve for a plurality of cells extracted from a plurality of rechargeable batteries, wherein the impedance measurement assembly comprises a controller and an adjustable load, wherein each impedance curve is descriptive of an internal impedance of the respective cell as a function of frequency over a predefined frequency range, derived via the following procedure:

setting, by the controller, an impedance of the adjustable load coupled between terminals of the respective cell between two or more predefined values according to a multi-frequency pseudo-random pulse sequence (PRPS) that represents a plurality of frequency components at a predefined frequency resolution within the predefined frequency range and that defines switching between said two or more predefined values as a function of time, and deriving, by the controller, the internal impedance of the respective cell over the predefined frequency range based on a voltage across the terminals of the respective cell and an electric current supplied to the adjustable load as a function of time;

determining, by the impedance measurement assembly, for each of the plurality of cells, respective one or more impedance characteristics based on the impedance curve determined for the respective cell, wherein said one or more impedance characteristics for a given cell comprise an indication of the number of partially circular segments appearing in a complex-plane representation of the impedance curve determined for the respective cell and respective frequency sub-ranges within which said partially circular segments appear;

sorting, by the controller or a computing apparatus operably coupled to the measurement arrangement, the plurality of cells into one of a first quality class or a second quality class in accordance with the one or more impedance characteristics determined for the plurality of cells and further assigning those cells that are assigned into the first cell quality class into one of two or more cell quality sub-classes in accordance with the one or more impedance characteristics determined for the plurality of cells in consideration of respective one or more reference impedance characteristics that represent a reference impedance curve; and selecting, by the controller or the computing apparatus operably coupled to the measurement arrangement, a set of the plurality of cells sorted into the first quality class for one or more batteries, wherein the one or more impedance characteristics further comprise at least one of the following:

frequencies at which local minima of the impedance appear, frequencies at which local maxima of the impedance appear, respective minima of resistance within one or more frequency sub-ranges, respective maxima of resistance within one or more frequency sub-ranges, respective minima of reactance within one or more frequency sub-ranges, respective maxima of reactance within one or more frequency sub-ranges, impedance as a function of frequency, an overall shape of a complex-plane representation of the impedance curve, respective diameters of partially circular segments in the complex-plane representation of the impedance curve.

* * * * *